United States Patent
Ray

(10) Patent No.: US 9,866,422 B1
(45) Date of Patent: Jan. 9, 2018

(54) METHODS OF BLIND SOURCE SEPARATION FILTER RESOURCE MANAGEMENT

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/296,233

(22) Filed: Oct. 18, 2016

(51) Int. Cl.
  *H04L 27/26* (2006.01)
  *H04L 12/26* (2006.01)

(52) U.S. Cl.
  CPC ........ *H04L 27/2688* (2013.01); *H04L 43/028* (2013.01)

(58) Field of Classification Search
  USPC ................................. 375/346, 274; 455/254
  See application file for complete search history.

(56) References Cited

U.S. PATENT DOCUMENTS

| | | | |
|---|---|---|---|
| 6,876,321 B1 | 4/2005 | Slutzky et al. | |
| 7,242,346 B1 | 7/2007 | Slutzky et al. | |
| 7,676,002 B2* | 3/2010 | Nam | H04L 27/0012 375/274 |
| 7,822,385 B2* | 10/2010 | Lopez | H04B 1/1036 455/254 |
| 8,139,535 B2* | 3/2012 | Hsuan | H04W 24/02 370/329 |
| 9,046,593 B2 | 6/2015 | Ray | |
| 2003/0161418 A1* | 8/2003 | Steele | H04L 25/03057 375/346 |
| 2004/0156448 A1* | 8/2004 | Sahlin | H04L 27/0012 375/316 |
| 2017/0178664 A1* | 6/2017 | Wingate | G10L 21/0308 |

OTHER PUBLICATIONS

Aishwarya et al., "Pulse digitizer generator for ESM systems", Int'l J. Engineering Trends and Technology, vol. 4, Issue 9, Sep. 2013, pp. 3809-3813.
Mahmoud et al., "Radar Parameter Generation to Identify the Target", Journal of Engineering, vol. 17, No. 1, Feb. 2011, pp. 173-185.

* cited by examiner

*Primary Examiner* — Eva Puente
(74) *Attorney, Agent, or Firm* — Ostrager Chong Flaherty & Broitman P.C.

(57) ABSTRACT

Systems and methods that solve the problem of scheduling the fixed filter resources of a blind source separation subsystem by choosing in real time the center frequency and bandwidth of each filter in such a way as to allow new and existing signals to be separated out in consistent channels, with as few missed signals as possible given the filter resources available. The proposed method comprises an algorithm that uses a periodic time/frequency covering map to set the center frequency and bandwidth of each filter over all time by acquiring energy measurements from the filtering subsystem using existing filter settings and continuously adaptively updating those settings while maintaining optimal coverage in time and frequency.

21 Claims, 11 Drawing Sheets

METHODS OF BLIND SOURCE SEPARATION FILTER RESOURCE MANAGEMENT

BACKGROUND

The technology disclosed herein generally relates to methods and apparatus for detecting and classifying repetitive signals.

A receiver system is any system configured to receive energy waves and process these energy waves to identify desired information carried in the energy waves. As used herein, an "energy wave" is a disturbance that propagates through at least one medium while carrying energy. For examples, energy waves may comprise electromagnetic waves, radio waves, microwaves, sound waves or ultrasound waves.

Typically, a receiver system includes a transducer and a receiver. A transducer may be any device configured to convert one type of energy into another type of energy. The transducers used in a receiver system are typically configured to receive energy waves and convert these energy waves into an electrical signal. An antenna is one example of a transducer. A receiver processes the electrical signal generated by a transducer to obtain desired information from the electrical signal. The desired information includes information about signals carried in the energy waves.

Oftentimes, energy waves are used to carry repetitive signals. A repetitive signal is a signal that has a time period over which some aspect of the signal repeats. Repetitive signals are used in timing operations, synchronization operations, radar operations, sonar operations, and other suitable operations. For example, the characteristics of a repetitive signal may be used to synchronize two or more devices.

In some situations, a receiver system may receive energy waves carrying a repetitive signal but may be unable to identify desired information about the repetitive signal. For example, the receiver system may be unable to detect and/or classify the repetitive signal. Classifying a repetitive signal may include identifying one or more of the following exemplary parameters: frequency, pulse width, type of modulation, period, phase, and/or other suitable characteristics of the repetitive signal.

In at least some known signal processing systems, a plurality of mixed signals (e.g., radar signals) are received by a sensor communicatively coupled to a plurality of blind source separation (BSS) filters. Using signal processing techniques, the BSS filters are configured to separate and identify repetitive signals of interest from the plurality of mixed signals. To improve performance, at least some known BSS filters use pipelining and paralleling techniques.

Blind source separation subsystems typically have a set of filters (often instantiated as a set of circuits in a field-programmable gate array or application-specific integrated circuit, but can also be instantiated via software on a general purpose processor or digital signal processor) that is limited in processing ability. These filters typically have two main parameters, center frequency and bandwidth. There are other parameters, such as number of filter zeros and poles, but these are often fixed. The problem is to take a fixed set of tunable filters with two parameters (center frequency and bandwidth) and separate as many signals of interest (SOI) as possible from a wideband signal collection in real time given the limited filter resources.

Existing solutions typically base the choice of center frequency and bandwidth on the current highest unprocessed signal energy that is detected and may use bandwidth only in a few specific values if energy is present in an adjoining filter. This may lead to inefficient use of such hardware and missing pulsed signals. In addition, the channel that outputs a particular signal is not necessarily consistent from one pulse to another.

It would be desirable to provide enhanced systems and methods for scheduling the fixed filter resources of a blind source separation subsystem.

SUMMARY

The subject matter disclosed in detail below is directed to systems and methods that solve the problem of scheduling the fixed filter resources of a blind source separation subsystem by choosing in real time the center frequency and bandwidth of each filter in such a way as to allow new and existing signals to be separated out in consistent channels, with as few missed signals as possible given the filter resources available. The proposed method comprises an algorithm that uses a periodic time/frequency covering map to set the center frequency and bandwidth of each filter over all time by acquiring energy measurements from the filtering subsystem using existing filter settings and continuously adaptively updating those settings while maintaining optimal coverage in time and frequency. Also, a non-transitory tangible computer-readable storage medium (also referred to herein as "memory") is used so that future pulsed signals (the main type of radar signal) will be tuned to at the appropriate time, allowing the filter hardware to multitask in an efficient manner. Together these create a subsystem that does blind source separation channel filter resource management (RM).

In accordance with some embodiments, the algorithm is a recursive adaptive covering map with periodic memory that allows repeating pulsed signals to be anticipated properly and output on a consistent channel, but still allows new signals to be discovered at any frequency and time. The algorithm accomplishes the foregoing by computing probabilities of the presence of signals of interest.

In accordance with embodiments disclosed in detail below, one of the responsibilities of a BSS control module is to coordinate all the BSS channels to use these limited filter resources efficiently, by scheduling the fixed filter resources, each with tunable center frequency and bandwidth, to allow new and existing signals anywhere within the input bandwidth to be separated out in consistent channels. Furthermore, the BSS subsystem should achieve this with as few missed signals as possible given the filter resources available.

One aspect of the subject matter disclosed in detail below is a method for performing blind source separation of signals, comprising: (a) receiving signals; (b) denoising the signals received using a denoising module; (c) separating the denoised signals as a function of frequency using respective filters of a multiplicity of channels; (d) generating first information vectors comprising respective data sets of parameter values of separated signals, wherein each data set of parameter values making up an information vector of the first information vectors comprises a frequency, an amplitude and a pulse width of a respective separated signal separated by the filter of a respective channel; (e) collecting the data sets of parameter values of the first information vectors; and (f) directing a filter of one channel of the multiplicity of channels to separate a particular frequency based on the collected data sets of parameter values of the first information vectors. In accordance with some embodiments, the method further comprises: (g) finding an event in the collected data sets of parameter values of the first information vectors, which found event is associated with the particular frequency; (h) associating a signal-of-interest priority value with the found event; (i) determining a current minimum signal-of-interest priority value associated with one channel of the multiplicity of channels; and (j) comparing the signal-of-interest priority value associated with the found event to the current minimum signal-of-interest priority value, wherein the one channel is directed to tune its filter with the particular frequency in response to the signal-of-interest priority value associated with the found event being greater than the current minimum signal-of-interest priority value. In addition, the method further comprises: (k) determining whether any other channel of the multiplicity of channels is currently processing the particular frequency or not; and (l) performing step (f) in response to a determination in step (k) that none of the multiplicity of channels are currently processing the particular frequency. In accordance with other embodiments, the method further comprises: generating second information vectors comprising respective data sets of parameter values of denoised signals, wherein each data set of parameter values making up an information vector of the second information vectors comprises a frequency range and an energy of a respective denoiser state; collecting the data sets of parameter values of the second information vectors; computing respective energies corresponding to the collected first information vectors;

and subtracting the computed energies corresponding to the collected first information vectors from the total energies of the collected second information vectors for each frequency range. In one implementation, the step of associating a signal-of-interest priority value with the found event comprises setting the associated signal-of-interest priority value equal to a maximum of a first a priori signal-of-interest priority value corresponding to the particular frequency and a second a priori signal-of-interest priority value corresponding to a denoiser energy of a denoiser state having the particular frequency.

Another aspect of the subject matter disclosed in detail below is a method for performing blind source separation of signals, comprising: receiving signals; denoising the signals received using a denoising module; separating the denoised signals as a function of frequency using respective filters of a multiplicity of channels; generating first information vectors comprising respective data sets of parameter values of separated signals, wherein each data set of parameter values making up an information vector of the first information vectors comprises a frequency, an amplitude and a pulse width of a respective separated signal separated by the filter of a respective channel; adding the data sets of parameter values of the first information vectors to a first histogram; generating second information vectors comprising respective data sets of parameter values of denoised signals, wherein each data set of parameter values making up an information vector of the second information vectors comprises a frequency range and an energy of a respective denoiser state; adding the data sets of parameter values of the second information vectors to a second histogram; computing respective energies of the first information vectors; subtracting the computed energies from the energies of associated denoiser states in the second histogram; finding an event having an associated frequency in the first histogram; associating a signal-of-interest priority value with the found event; determining a current minimum signal-of-interest priority value associated with one channel of the multiplicity of channels; comparing the signal-of-interest priority value associated with the found event to the current minimum signal-of-interest priority value; sending a request to the one channel to tune its filter with the frequency associated with the found event in response to the signal-of-interest priority value associated with the found event being greater than the current minimum signal-of-interest priority value; and tuning the filter of the one channel with the frequency associated with the found event. In accordance with some embodiments, the step of associating a signal-of-interest priority value with the found event comprises setting the associated signal-of-interest priority value equal to a maximum of a first a priori signal-of-interest priority value corresponding to the frequency associated with the found event and a second a priori signal-of-interest priority value corresponding to the denoiser energy of a denoiser state having the frequency associated with the found event.

A further aspect of the subject matter disclosed in detail below is a method for performing blind source separation of signals, comprising: (a) receiving signals; (b) denoising the signals received using a denoising module; (c) separating the denoised signals as a function of frequency using respective filters of a multiplicity of channels; (d) generating information vectors comprising respective data sets of parameter values of denoised signals, wherein each data set of parameter values making up an information vector comprises a frequency range and an energy of a respective denoiser state; (e) collecting the data sets of parameter values of the information vectors; and (f) directing a filter of one channel of the multiplicity of channels to separate a particular frequency based on the collected data sets of parameter values of the information vectors. In accordance with some embodiments, this method further comprises: (g) finding a maximum signal-of-interest priority value corresponding to one denoiser state of the respective denoiser states associated with the particular frequency; (h) determining a current minimum signal-of-interest priority value associated with one channel of the multiplicity of channels; and (i) comparing the maximum signal-of-interest priority value to the current minimum signal-of-interest priority value, wherein the one channel is directed to tune its filter with the particular frequency in response to the maximum signal-of-interest priority value associated with the found event being greater than the current minimum signal-of-interest priority value. The of the one channel will be tuned to process the particular frequency.

Yet another aspect of the subject matter disclosed in detail below is a system for processing received signals, comprising: a signal denoising module; a multiplicity of channels communicatively coupled to the signal denoising module, each channel comprising a respective filter and respective channel state machines for configuring the filters to separate denoised signals as a function of frequency; a control module communicatively coupled to the channel state machines of the multiplicity of channels; and a separated signal information vector generation module communicatively coupled to the multiplicity of channels and to the control module, wherein the separated signal information vector generation module is configured to generate information vectors comprising respective data sets of parameter values of separated signals, wherein each data set of parameter values making up an information vector comprises a frequency, an amplitude and a pulse width of a respective separated signal separated by the filter of a respective channel. The control module is configured to collect the data sets of parameter values of the information vectors and direct a filter of one channel of the multiplicity of channels to separate a particular frequency based on the collected data sets of parameter values of the information vectors. In accordance with some embodiments, the control module is further configured to: find an event in the collected data sets of parameter values of the information vectors, which found event is associated with the particular frequency; associate a signal-of-interest priority value with the found event; determine a current minimum signal-of-interest priority value associated with one channel of the multiplicity of channels; and compare the signal-of-interest priority value associated with the found event to the current minimum signal-of-interest priority value, wherein the one channel is directed to tune its filter with the particular frequency in response to the signal-of-interest priority value associated with the found event being greater than the current minimum signal-of-interest priority value. In addition, the control module is further configured to determine whether any other channel of the multiplicity of channels is currently processing the particular frequency or not, wherein the control module determines the current minimum signal-of-interest priority value in response to a determination that none of the multiplicity of channels are currently processing the particular frequency.

Other aspects of systems and methods for managing filter resources in a blind source separation system are disclosed below.

BRIEF DESCRIPTION OF THE DRAWINGS

The features, functions and advantages discussed in the preceding section can be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
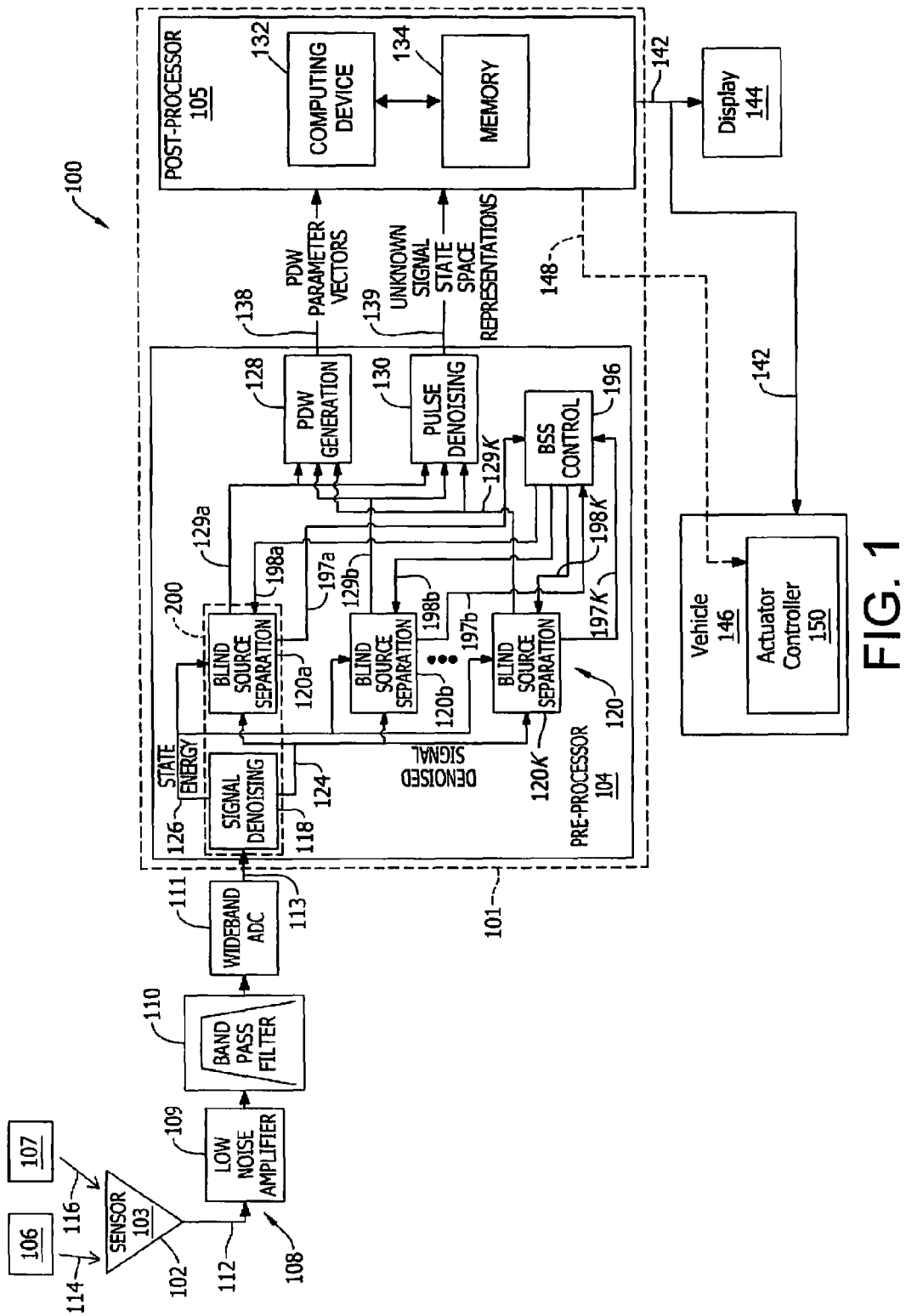
FIG. 1 is a block diagram showing a denoising and BSS architecture incorporated in a signal processing system for generating pulse descriptor words (POWs) using blind source separation.

Illustrative embodiments of BSS subsystems are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Electronic warfare systems are receive-only systems that have front-end receivers that produce pulse descriptor words (PDW) for each radar pulse they detect. They are unlike radar systems in that they do not naturally produce range and they must handle unknown signals rather than look for reflected versions of their transmitted signals. The digital versions of these receivers are typically designed as a filter bank; within each filter channel, radar pulses are separated from other coincident signals and have their noise decreased by the relative filter bandwidth compared to the total input bandwidth. These pulses with their increased signal-to-noise ratio (SNR) are processed to estimate PDW elements such as pulse width, frequency, time of arrival, bandwidth, and amplitude. While channelizers have many advantages, they also have key disadvantages such as large size, weight and power due to the multipliers and adders required for very large filter banks that operate continuously whether a signal is present or not. In addition, signals that do not match the bandwidth and frequency of each filter in the filter bank are processed sub-optimally or split across filter channels, resulting in missed, false and inaccurate PDWs. Finally, signals of unknown type that do not match the model of simple pulsed signals largely fail to be processed correctly.

If a channelizer is not used, the two main processing tasks of noise reduction and signal separation must be done using different methods. Noise reduction can be done using denoising techniques which model signals via adaptive recursive equations that enhance the structure of signals and consequently reduce the unstructured signal noise. Signal separation requires constructing on-the-fly real-time automated matched filter construction, which is the subject of this disclosure. To be specific, blind source separation is the process of taking one or more signal collection inputs (that have typically been denoised so that noise has been reduced, but may also have come through a channelizer system previously described) and attempting to separate each signal within the summed collection of signals without a priori knowledge of the signals. This separation is based primarily on frequency content, i.e., energy in a contiguous range of frequencies. This is the most important and most practical separation criterion. Thus the term "matched filtering" as used herein is only with respect to frequency content, rather than with an unknown signal template.

By way of illustration of the utility and industrial applicability of the technology disclosed herein, wideband radar receivers will often see many radars operating at the same time, in addition to noise and other interfering signals. If the receiver computes Fourier transforms of its received signal over time, pulses at different frequencies will occur. If these pulses are counted in their frequency bins, what develops is a radar pulse histogram over frequency. Since radars are often agile in frequency, lumps or peaks will develop around the center frequency of each radar transmitter received. The signal classification task is then to separate out and classify all the radar signals received. This can more generally be applied to other parameters in addition to frequency. For pulsed signals, pulse width can be measured and can also be used to separate signals. Other parameters are modulation type and rate, pulse repetition rate, etc.

For the sake of illustration, an embodiment will now be described that separates incoming radar pulses and then generates pulse descriptor words (PDWs) for use in controlling a vehicle. However, it should be appreciated that the BSS subsystem disclosed herein may be used in applications other than vehicle control.

FIG. 1 is a block diagram identifying components of a signal processing system 100 for generating PDWs using blind source separation (BSS). Also known as blind signal separation, BSS subsystems and methods are employed for separation (i.e., filtering) of one or more source signals of interest from a plurality of mixed signals. In applications including, without limitation, an underdetermined case (i.e., fewer observed signals than signal sources), blind source separation facilitates filtering pure signals of interest from an arbitrary set of time-varying signals (e.g., radar pulses from one or more signal emitters) without relying on substantial amounts of known information about the source signals or the signal mixing process.

In an exemplary implementation, signal processing system 100 includes a signal data processor 101 communicatively coupled to an antenna 102 by way of a pre-conditioner 108. Antenna 102, in the exemplary implementation, is embodied as a wide-area sensor 103. Signal data processor 101 includes a pre-processor 104 and a post-processor 105. Sensor 103 is configured to surveil at least one radar signal emitter (two radar signal emitters 106 and 107 are indicated). In one implementation, pre-conditioner 108 includes at least one electronic component (e.g., a low-noise amplifier 109, a band pass filter 110, and a wideband analog-to-digital converter (ADC) 111) configured to pre-condition a sensor output signal 112. In operation, pre-conditioner 108 is configured to convert a sensor output signal 112 received from sensor 103 into a conditioned signal 113 transmitted to pre-processor 104. Each conditioned signal 113 is derived from a time-varying signal received at sensor 103. Time-varying signals may include a mix of signals received from radar signal emitters 106 and 107. For example, time-varying signals may include a first radar signal 114 generated by radar signal emitter 106 or a second radar signal 116 generated by radar signal emitter 107, which signals are received by sensor 103.

In the exemplary embodiment, pre-processor 104 includes one or more signal denoising modules 118, and a plurality of blind source separation (BSS) modules 120. Each BSS module 120 is coupled to a single signal denoising module 118, and represents one BSS channel 200. A total number of BSS channels 200 in signal processing system 100 is expressed as K. Signal denoising module 118 transmits a denoised signal 124 and a state energy signal 126 to each respective BSS module 120 (e.g., 120a, 120b, . . . , 120K) of the plurality of BSS modules 120. State energy signal 126 represents a quantity (e.g., an analog voltage level) that is proportional to the sum of the absolute value of an amplitude of incoming signal 113 squared at particular sampled time points (i.e., states).

In operation, incoming signal 113 is transmitted from pre-conditioner 108 to signal denoising module 118, where incoming signal 113 undergoes signal denoising and is subsequently transmitted as denoised signal 124 to each BSS module 120. For example, first radar signal 114 is initially received at sensor 103 as a pulse having signal characteristics including, without limitation, a frequency and a bandwidth. In this example, a single pulse of first radar signal 114, after processing by pre-conditioner 108, is then received at signal denoising module 118 as a mixed signal (i.e., the incoming signal 113 represents a signal pulse of the first radar signal 114 and has various characteristics including, without limitation, noise and information other than the desired information of interest). Signal denoising module 118 denoises the mixed incoming signal 113 prior to transmitting denoised signal 124 having a frequency and a bandwidth (or a regular pattern of frequencies and bandwidths) to the BSS modules 120. Methods implemented by signal processing system 100 are performed in substantially real time by the devices and systems described above, and as shown and described below in further detail with reference to FIG. 2.

Pre-processor 104 further includes a BSS control module 196 coupled to each BSS module 120. BSS control module 196 is configured to transmit a respective BSS control signal 198a through 198K to each of BSS modules 120, as further shown and described below with reference to FIG. 2. The plurality of BSS modules 120 connected to the BSS control module 196 will be referred to herein as the "BSS subsystem".

Further, in an exemplary implementation, pre-processor 104 comprises a PDW generation module 128 and a pulse denoising module 130, both of which are coupled to receive blind source separated signals 129 from a plurality of BSS modules 120 of a BSS subsystem. PDW generation module 128 generates PDW parameter vector signals 138 based on respective blind source separated signals 129 (e.g., 129a, 129b, . . . , 129K) received from the BSS modules 120 (e.g., 120a, 120b, . . . , 120K). Each PDW parameter vector signal 138 contains data representative of characteristics of interest of one of radar signals 114 and 116 derived from a singular pulse of blind source separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on blind source separated signals 129. Unknown signal state space representation signal 139 contains data representative of additional (e.g., non-PDW-type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105.

Signal denoising module 118, PDW generation module 128, and pulse denoising module 130 include suitable signal filtering, signal amplification, signal modulation, signal separation, signal conditioning, and/or ADC circuitry implemented using analog and/or digital electronic circuit components. Also, in the exemplary embodiment, each BSS module 120 (e.g., 120*a*, 120*b*, ..., 120K) transmits a respective blind source separated signal 129 (e.g., 129*a*, 129*b*, ..., 129K) to PDW generation module 128 and to pulse denoising module 130. Each BSS module 120 (e.g., 120*a*, 120*b*, ..., 120K) may be implemented in firmware on a field-programmable gated array (FPGA) or in pure hardware in an application-specific integrated circuit (ASIC). Alternatively, each BSS module 120 (e.g., 120*a*, 120*b*, ..., 120K) may be implemented as software running on a processor.

Further, in an exemplary implementation, post-processor 105 comprises a computing device 132 and a memory 134. The memory 134 comprises one or more non-transitory tangible computer-readable storage media. Post-processor 105 is communicatively coupled to pre-processor 104. In accordance with one embodiment, the computing device 132 is a processor running software.

In accordance with some embodiments, the PDW generation module 128 is configured to receive a respective blind source separated signal 129 from each BSS module 120. PDW generation module 128 is further configured to transmit a PDW parameter vector signal 138 to post-processor 105. PDW parameter vector signal 138 received by computing device 132 is stored as computer-readable data in memory 134 including, without limitation, as at least one buffered data set.

In accordance with one implementation, the PDW generation module 128 will send each PDW to the computing system 132 as a PDW parameter vector signal 138 similar to (amplitude, time of arrival, center frequency, pulse width and bandwidth)=(amp, toa, cf, pw, bw). The PDW for each intercepted signal is stored in a pulse buffer for further processing by the computing system 132. As part of such processing, the PDWs are sorted and deinterleaved by clustering the incoming radar pulses into groups. In principle, each group should have characteristics representative of a single radar source or class of radar sources which allows that radar source or class to be identified. The identity of a particular signal is usually inferred by correlating the observed characteristics of that signal with characteristics stored in a list that also contains the identity of known radars.

In accordance with some embodiments, the pulse denoising module 130 is configured to receive blind source separated signals 129 from each BSS module 120. Pulse denoising module 130 is further configured to transmit an unknown signal state space representation signal 139 to post-processor 105. Unknown signal state space representation signal 139 received by computing device 132 is stored as computer-readable data in memory 134, including, without limitation, as at least one buffered data set. In an exemplary implementation, computing device 132 fetches buffered data sets from memory 134 for processing using a computer-based method employing an operating system running software executed from instruction set data also stored in memory 134.

The computing device 132 is configured to perform operations based on data contained in the PDW parameter vector signals 138 and unknown signal state space representation signals 139. Such operations include, without limitation, detecting, processing, quantifying, storing, and controlling a display device 144 for displaying (e.g., in human-readable data form) various characteristics of at least one of the radar signals 114 and 116 represented as data in the PDW parameter vector signals 138 and unknown signal state space representation signals 139. For example, a PDW parameter vector signal 138 generated by PDW generation module 128 may contain a plurality of PDW vector data blocks structured in a vector format, where each PDW vector data block contains one parameter of the first radar signal 114. Parameters representative of at least one characteristic of the first radar signal 114 contained in one PDW vector data block may include, without limitation, frequency, bandwidth, time of arrival, time of departure, pulse width, pulse amplitude, pulse repetition interval, and/or AOA. The computing device 132 is configured to read at least a portion of PDW parameter vector signal 138 and carries out at least one of the aforementioned operations on at least one PDW vector data block. Also, in an exemplary implementation, the computing device 132 is configured to read and separate (i.e., deinterleave) PDW parameter vector signal 138 into its constituent PDW vector data blocks, and store fewer PDW vector data blocks including, without limitation, at least one predetermined type of information, in memory 134 than the total number of PDW vector data blocks contained in PDW parameter vector signal 138. In other implementations, the computing device 132 is configured to read and separate all PDW vector data blocks from one another and store all data contained therein in memory 134. The computing device 132 can also be configured to facilitate the aforementioned operations substantially simultaneously (i.e., in real time) with receipt of at least one of the plurality of radar signals 114 and 116 by the sensor 103.

Resultant data from operations performed by the computing device 132 are stored in memory 134. Further, in the exemplary implementation, computing device 132 causes post-processor 105 to transmit a human-readable data signal 142 to a human machine interface to facilitate at least one of an interaction, a modification, a visualization, at least one further operation, and a viewable recording of information about at least one radar signal 114 and 116 by a user of signal processing system 100. The human machine interface may be, for example, a display device 144 which receives the human-readable data signal 142 from post-processor 105. In one example, characteristics of radar signal emitters 106 and 107 determined by signal processing system 100 are displayed on display device 144 as a map having a grid representative of a physical spatial domain including a surveillable space of sensor 103, where locations and identifying information of radar signal emitters 106 and 107 are displayed and plotted substantially in real time. The human-readable data signal 142 may also be transmitted from post-processor 105 to at least one device and/or system (e.g., an aerial or ground-based vehicle 146) associated with signal processing system 100. Further, the computing device 132 enables post-processor 105 to transmit, in substantially real time, an actuator control signal 148 to an actuator controller 150 included within vehicle 146 to facilitate controlled movements thereof. For example, vehicle 146 may be a remotely and/or autonomously operated land vehicle or an unmanned aerial vehicle.

In operation, conditioned signal 113 is received by signal denoising module 118, where it undergoes signal denoising. The denoised signal 124 is transmitted to each BSS module 120. For example, first radar signal 114 may be transmitted to sensor 103 by first radar signal emitter 106 as a pulse having signal characteristics including, without limitation, a frequency (e.g., a center frequency) and a bandwidth. In this example, a single pulse of first radar signal 114 is received at signal denoising module 118 as a mixed signal (i.e., a signal pulse having various characteristics including, without limitation, noise and information other than the desired information of interest). Signal denoising module 118 denoises the mixed signal prior to transmitting a denoised signal 124 having a frequency and a bandwidth (or a regular pattern of frequencies and bandwidths). Methods implemented by signal processing system 100 are performed in substantially real time by the devices and systems described above, and as shown and described below in further detail with reference to FIG. 2.

In one mode of operation, at least one of frequency and bandwidth information contained in respective PDWs is plotted on a map on the display device 144 along with locations of respective radar signal emitters 106 and 107 to facilitate accurate tracking of locations and association with those particular radar signal emitters. In cases where at least one radar signal emitter is mobile, the map on display device 144 updates location information of at least one respective mobile radar signal emitter in substantially real time. Furthermore, the computing device 132 determines at least one of a velocity, an acceleration, a trajectory, and a track (i.e., including present and prior locations) of one or more mobile radar signal emitters (e.g., radar signal emitters 106 and 107). In another mode of operation, characteristics determined by signal data processing methods implemented by the signal data processor 101 may trigger a variety of substantially real-time physical actions in physical devices and systems in communication with the signal processing system 100. For example, characteristics of various radar signal emitters, including frequency and bandwidth determined by signal data processing methods implemented by signal processing system 100, may be transmitted in substantially real time as data to actuator controller 150 in vehicle 146 (e.g., rudders and flaps of a unmanned aerial vehicle) to facilitate maneuvers thereof, for example, to avoid an area of operation of an unauthorized radar signal emitter determined to be a threat or to move toward the unauthorized emitter to eliminate the threat. As a further example, characteristics of radar signal emitters 106 and 107 determined by signal data processing methods described herein may be transmitted in substantially real time in a control signal to at least one of an electronic support measure (ESM) device and an electronic warfare (EW) system associated with signal processing system 100 to direct, for example, a radar jamming signal at a particular radar signal emitter operating in the surveillable environment of sensor 103 without authorization.

As further shown and described below with reference to FIG. 2, each BSS module 120 in signal processing system 100 implements filtering methods with dynamic updating to generate high-quality PDWs containing at least one of amplitude, frequency, center frequency, bandwidth, pulse time of arrival, and pulse width information. Such improved accuracy and resolution of PDWs to track, for example, frequency and bandwidth of, for example, individual radar signals facilitates at least one of identifying, determining, and analyzing at least one radar signal emitter from which associated radar signals are emitted. For example, information including, without limitation, information derived from PDWs from at least one of the radar signal emitters 106 and 107 may be displayed on display device 144 after being transmitted thereto by post-processor 105 as human-readable data signal 142, as described above. This enhanced information enables signal processing system 100 to distinguish first radar signal emitter 106 from second radar signal emitter 107. Also, for example, different radar signal emitters in a surveilled environment of sensor 103 may be plotted at respective locations (i.e., grid coordinates) on display device 144 (i.e., as a map).

Also, in operation, each BSS module 120 separates a respective denoised signal 124. As further shown and described below with reference to FIGS. 2 and 3, each BSS module 120 contains a plurality of tunable filters, wherein each filter operates in accordance with filter parameters that include, without limitation, a center frequency and a bandwidth. Further, in the exemplary embodiment, pre-processor 104 includes a BSS control module 196, which facilitates controlling BSS modules 120. BSS control module 196 receives respective BSS data signals 197 (e.g., 197a, 197b, . . . , 197K) containing BSS-related information including, without limitation, frequency, bandwidth, and state, from each BSS module 120. Based on the BSS-related information contained in BSS data signals 197, BSS control module 196 also generates and transmits respective BSS control signals 198 (e.g., 198a, 198b, . . . , 198K) back to each respective BSS module 120 to control, for example and without limitation, a timing of receipt of denoised signal 124 and transmission of respective blind source separated signals 129 to at least one of PDW generation module 128 and pulse denoising module 130. Information contained in BSS data signals 197 and BSS control signals 198 is used by BSS control module 196 to facilitate implementation of a feedback control loop. The BSS control module 196 is further configured to tune (i.e., update) the center frequency and bandwidth of each filter of the plurality of filters in each BSS module 120 to enable radar signals which fall within the input bandwidth to be separated out in consistent BSS channels. BSS control module 196 also implements scheduling of fixed filter resources in each BSS module 120, which facilitates separation of denoised signals 124 with as few missed signals as possible given the filter resources available.

In accordance with one embodiment, BSS control module 196 comprises a processor running software. All of the other modules inside pre-processor 104 can be implemented in a processor running software or in firmware on an FPGA or in pure hardware in an ASIC. And these could be mixed, some in hardware and some in software. However, the most reasonable implementation would be in hardware or in an FPGA for the other modules inside the pre-processor 104.

Figure 2:
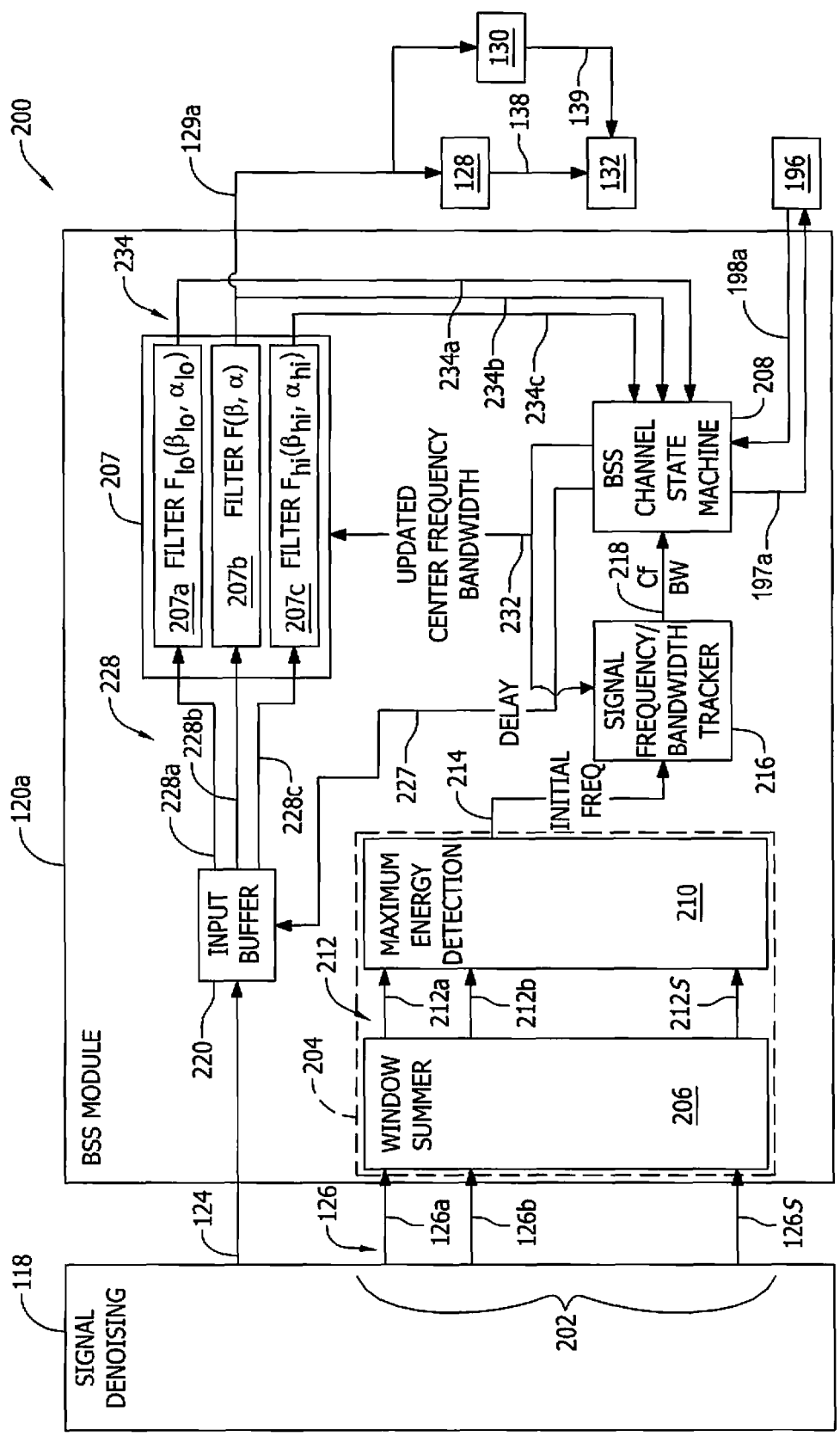
FIG. 2 is a block diagram identifying components of a blind source separation channel (hereinafter "BSS channel") that may be used in the signal processing system depicted in FIG. 1 to track both frequency and bandwidth.

FIG. 2 is a block diagram identifying components of an exemplary BSS channel 200 that may be used in the signal processing system 100 depicted in FIG. 1. In an exemplary implementation, signal denoising module 118 transmits a denoised signal 124 and a plurality of state energy signals 126. Also, in an exemplary implementation, the plurality of state energy signals 126 are representative of a state output 202 of the signal denoising module 118. Each state energy signal 126 of the plurality of state energy signals 126 contains information that is representative of the state (e.g., the analog voltage level that is proportional to the amplitude of incoming signal 113 at particular sampled time points) of a respective state output 202 of signal denoising module 118. The plurality of state energy signals 126 are received by a state energy analysis subsystem 204. State energy analysis subsystem 204 determines a center frequency (i.e., $f_0$) of respective state energy signals 126 of S signals (e.g., 126a, 126b, . . . , 126S) corresponding to S filter states of a filtering subsystem 207. State energy analysis subsystem 204 includes a window summer module 206 configured to determine a total energy within a set of S windows of length $N_e$ (i.e., one for each state of a BSS channel state machine module 208 of BSS module 120a). BSS channel state machine module 208 coordinates a timing of filtering of denoised signal 124 by filtering subsystem 207. State energy analysis subsystem 204 also includes a maximum energy detection module 210 coupled to window summer module 206. Maximum energy detection module 210 is configured to receive S summed window signals 212 (e.g., 212a, 212b, . . . , 212S) and determine a maximum energy of each summed window signal 212 of the S summed window signals 212. Maximum energy detection module 210 is further configured to determine and transmit a first or initial frequency signal 214 to a signal frequency and bandwidth tracker module 216 coupled to maximum energy detection module 210.

In an exemplary embodiment, initial frequency signal 214 is representative of the $f_0$ of the maximum energy of the respective state energy signal 126 corresponding to the associated state of BSS channel 200. Signal frequency and bandwidth tracker module 216 uses initial frequency signal 214 to determine a center frequency ("Cf") and a bandwidth ("BW") of the respective summed window signal 212 corresponding to the maximum energy state of BSS channel 200. Signal frequency and bandwidth tracker module 216 further outputs a Cf and BW signal 218 to BSS channel state machine module 208. BSS channel state machine module 208 is coupled to filtering subsystem 207, signal frequency and bandwidth tracker module 216, an input buffer module 220, and computing device 132. Substantially simultaneously with receipt of Cf and BW signal 218 by BSS channel state machine module 208 from signal frequency and bandwidth tracker module 216, input buffer module 220 delays filtering of denoised signal 124 by filtering subsystem 207 to enable BSS channel state machine 208 to update Cf and BW filter parameters of filtering subsystem 207 (as further described below).

Further, in an exemplary embodiment, filtering subsystem 207 is a tunable filter bank including a plurality of filter modules. In the illustrated embodiment, the filtering subsystem 207 includes a low filter ("$F_{lo}$") module 207a, a main filter ("F") module 207b, and a high filter ("$F_{hi}$") module 207c. In other implementations, filtering subsystem 207 may include more or less than three filter modules. Input buffer module 220 is coupled to and between filtering subsystem 207 and signal denoising module 118, and is configured to transmit a plurality of filter input signals 228 (e.g., 228a-c) to respective filter modules (e.g., 207a-c) in filtering subsystem 207. Input buffer module 220 is further configured to receive a delay signal 227 transmitted from a first output of the BSS channel state machine module 208. Delay signal 227 controls when the filter input signal 228 is sent from the input buffer 220 to the filtering subsystem 207. From a second output, BSS channel state machine module 208 transmits a center frequency and bandwidth update signal 232 to filtering subsystem 207. Center frequency and bandwidth update signal 232 enables continuous updating of Cf and BW operational parameters and associated filter coefficients α and β, respectively, of each filter module (e.g., 207a, 207b, and 207c) in filtering subsystem 207. Center frequency and bandwidth update signal 232 thus facilitates accurate tracking of denoised signal 124 frequency and bandwidth to yield a continuous and undistorted blind source separated signal 129a output from BSS module 120a.

Furthermore, in an exemplary implementation, filtering subsystem 207 is embodied as digital or analog electronic circuitry including, without limitation, circuits instantiated in at least one of a field-programmable gate array and an application-specific integrated circuit. Further, in an exemplary implementation, operational parameters of each filter module of the plurality of filter modules 207a-c in filtering subsystem 207 are stored in memory 134 (see FIG. 1), where they are updated substantially simultaneously (i.e., in real time) with transmission of center frequency and bandwidth update signals 232 by the BSS channel state machine module 208. Filter modules 207a-c have both a pipelined architecture (as described below in association with FIG. 3) and a parallelized architecture in the exemplary embodiment.

In the exemplary embodiment, filter modules 207a-c receive respective filter input signals 228a-c from input buffer module 220, and are each further coupled to BSS channel state machine module 208. Filtering subsystem 207 is further configured to transmit a plurality of signal energy signals 234, where filter modules 207a-c each transmit respective signal energy signals 234a-c respectively to BSS channel state machine module 208. Further, in the exemplary embodiment, filter module 207b also transmits signal energy signal 234b as the respective blind source separated signal 129a transmitted from BSS module 120a to PDW generation module 128 and to pulse denoising module 130 for further processing (e.g., deinterleaving of PDW parameter vector signal 138 by computing device 132, as shown and described above with reference to FIG. 1). Information contained in the plurality of signal energy signals 234 is used by BSS channel state machine module 208 for generating and transmitting center frequency and bandwidth update signal 232 to filtering subsystem 207 (as further shown and described below with reference to FIG. 3).

In operation, feedback in BSS channel 200 is used to determine where (e.g., at what value or values) to place the Cf and BW of each filter module (e.g., filter modules 207a-c) of filtering subsystem 207 over all time. The feedback includes acquiring energy measurements resulting from existing filter settings (e.g., from signal energy signals 234a-c), and continuously and adaptively updating respective filter parameters Cf and BW and filter coefficients α and β, while maintaining as complete a coverage in time and frequency as possible. Subsequent pulses of radar signals are filtered by filtering subsystem 207 with filter modules 207a-c having respective filter parameters and coefficients tuned to enable filtering subsystem 207 to multitask in a very efficient manner (e.g., under control, at least in part, of BSS control module 196, as described above with reference to FIG. 1).

Also, in operation, signal frequency and bandwidth tracker module 216 includes a tracking algorithm to track a value of the initial frequency signal 214. Specifically, the center frequency of the initial frequency signal 214 changes at any rate up to a maximum predetermined rate set by the tracking algorithm (e.g., determined by at least one of computing device 132, BSS channel state machine module 208, and BSS control module 196). A track window of the tracking algorithm is short enough to support a chirp rate, but long enough to handle the signal noise level. In particular, the tracking algorithm is robustly implemented by BSS channel 200 including, without limitation, in conjunction with computing device 132, as a function of all of the following: parameter and/or coefficient settings of the plurality of filter modules (e.g., 207a-c), noise levels, signal frequency change characteristics, amplitude differences, and ability to pull-in signals within range required by signal denoising module 118. For example, and without limitation, where signal denoising module 118 has twenty states (i.e., S=20) with a 1 GHz bandwidth, BSS channel 200 tracks radar signals with a frequency offset from an initial frequency (i.e., pull-in range) up to ±25 MHz (i.e., 0.025 GHz).

Further, in operation, each of the filter modules 207a-c in filtering subsystem 207 is embodied as at least one of a finite impulse response (FIR) filter and an infinite impulse response (IIR) filter. In an exemplary implementation, use of IIR-type filters in filtering subsystem 207 enables lower-cost filter devices having greater precision than FIR-type filters. Also, in an exemplary implementation, each BSS channel 200 processes radar signals rather than communications signals and, therefore, the effects of a non-constant group delay caused by using IIR filters is less important than with communications signals and IIR filters adequately meet the signal quality required for post-filtering PDW deinterleaving by post-processor 105.

Furthermore, in operation, main filter module 207b is used as the "correct" tracking filter for the filter input signal 228 being separated. Low filter module 207a and high filter module 207c are used in the tracking process to keep main filter module 207b on target in both frequency and bandwidth. Also, in an exemplary implementation, low filter module 207a and high filter module 207c are offset by fixed amounts in frequency and bandwidth and, as with main filter module 207b, are continuously monitored to facilitate appropriate and timely tuning of the center frequency and bandwidth of each filter module. In an alternative implementation, not shown, filtering subsystem 207 includes two (F and $F_{hi}$), rather than three, filter modules and a simplified tracking process tracks only frequency. In this alternative implementation, each BSS channel 200 has a fixed bandwidth.

In operation, each of the filter modules 207a-c in filtering subsystem 207 is parameterized by two values (i.e., center frequency and bandwidth) which are stored in memory 134. The center frequency and bandwidth values are updated by the BSS control module 196, including, without limitation, in conjunction with computing device 132, in as few as two hardware clock cycles. In the simplified tracking process wherein filtering subsystem 207 includes only a main filter module 207b ("F") and a high filter module 207c ("$F_{hi}$"), the center frequency of filter F is referred to as f and the bandwidth of filter F is referred to as w, so that:

$$\text{center frequency}(F_{hi}) = f + \Delta f \quad (1)$$

$$\text{bandwidth}(F_{hi}) = w \quad (2)$$

For the exemplary implementation, where filtering subsystem 207 includes three filter modules 207a-c, the center frequency and bandwidth of filter F are defined according to Eqs. (1) and (2), and the center frequency and bandwidth of filters $F_{lo}$ and $F_{hi}$ are defined as follows:

$$\text{center frequency}(F_{lo}) = f - \Delta f \quad (3)$$

$$\text{bandwidth}(F_{lo}) = w - \Delta w \quad (4)$$

$$\text{center frequency}(F_{hi}) = f + 2\Delta f \quad (5)$$

$$\text{bandwidth}(F_{hi}) = w + 2\Delta w \quad (6)$$

Also, in operation, filter input signal 228 is input to filtering subsystem 207 and main filter module 207b outputs blind source separated signal 129 to PDW generation module 128, as shown and described above with reference to FIG. 1. Separately, each of signal energy signals 234 output by filter modules 207a-c of filtering subsystem 207 has its output energy determined by at least one of filtering subsystem 207, BSS channel state machine module 208, and computing device 132, for example, by squaring and taking the absolute value (i.e., if using complex signals instead of real signals). This results in a sequence of energy measurement pairs or triples (E(n), $E_{lo}(n)$, $E_{hi}(n)$), where n=1, 2, etc. The determination of output energy of signal energy signals 234 facilitates the following updates to the center frequency (i.e., f) parameters of filter F and filter $F_{hi}$ in the simplified alternative implementation:

$$f \leftarrow f + \alpha_0 * [(E(n) - E_{hi}(n))/(E(n) + E_{hi}(n))] + \alpha_1 \quad (7)$$

For the exemplary implementation, where filtering subsystem 207 includes three filters F, $F_{hi}$, and $F_{lo}$, the f and w parameters are updated as follows:

$$f \leftarrow f + \alpha_0 * [(E(n) - E_{lo}(n))/(E(n) + E_{lo}(n))] + \alpha_1 * [(E(n) - E_{hi}(n))/(E(n) + E_{hi}(n))] + \alpha_2 \quad (8)$$

$$w \leftarrow w + \beta_0 * [E(n) - E_{lo}(n)]/[E(n) + E_{lo}(n)] + \beta_1 * [(E(n) - E_{hi}(n))/(E(n) + E_{hi}(n))] + \beta_2 \quad (9)$$

where initial values of coefficient vectors α and β are determined and stored in memory 134 during a pre-training process (e.g., implemented by at least one of computing device 132, BSS channel state machine module 208 and BSS control module 196), and are functions of window size, BW and signal-to-noise ratio (SNR). Initial values of α and β are determined from at least one of an initial denoised signal 124 and an initial state energy signal 126 received by BSS channels 200.

Referring again to FIG. 2, in operation of the exemplary embodiment, respective filter input signals (e.g., 228a, 228b, and 228c) derived from the denoised signal 124 are provided substantially simultaneously to each filter module 207a-c in filtering subsystem 207 of each BSS module 120. In BSS module 120a, for example, the resulting blind source separated signal 129a output by filtering subsystem 207 is further vectorized into PDW parameter vector signal 138 by PDW generation module 128 to further facilitate accurate tracking and determination of frequency and/or bandwidth of at least one radar signal. Therefore, each BSS channel 200 enables signal processing system 100 to implement high-performance real-time tracking of a plurality of time-varying radar signals streaming through pre-processor 104.

The aforementioned filtering methods enable signal processing system 100 to generate high-quality PDW parameter vector signals 138 that are used for identifying, determining, and analyzing radar signal emitters 106 and 107. For example, PDW parameter vector signals 138 associated with radar signal emitter 106 are displayed on display 144, as described above. Also, for example, improved information about frequencies and/or bandwidths contained in at least two PDW parameter vector signals 138 enable signal processing system 100 to distinguish first radar signal emitter 106 from second radar signal emitter 107. These radar signal emitters 106 and 107 are plotted at respective locations on display 144 (e.g., as a map).

Individual BSS channels are able to take the cues from the signal denoising module 118 as the starting point to begin tracking signals. However, a BSS filter resource management subsystem is preferably provided with overall knowledge and control of all the channels and with memory so that (for example) future pulsed signals (a primary type of radar signal) will be tuned to at just the right time, allowing the filter hardware to multitask in a very efficient manner.

Figure 3:
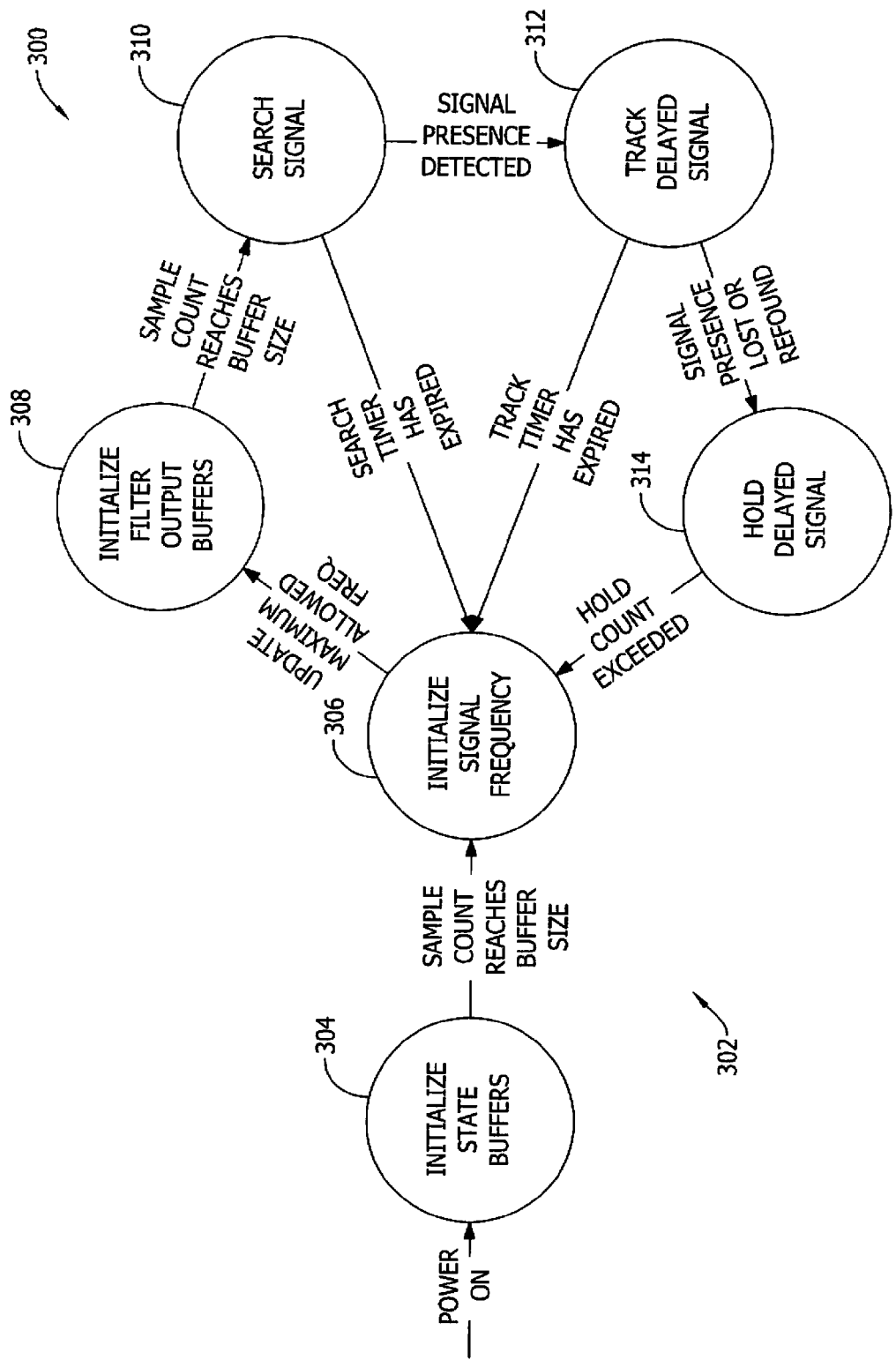
FIG. 3 is a diagram identifying states and transitions of a blind source separation channel state machine (hereinafter "BSS channel state machine") that may be used with the BSS channel depicted in FIG. 2.

FIG. 3 is a schematic diagram of an exemplary BSS channel state machine 300 that may be used with BSS channel 200 shown in FIG. 2. In an exemplary implementation, the BSS channel state machine 300 includes a plurality of states 302. The plurality of states 302 of BSS channel state machine 300 include a first state 304, a second state 306, a third state 308, a fourth state 310, a fifth state 312, and a sixth state 314. Also, in an exemplary embodiment, the BSS channel state machine 300 (including, without limitation, in conjunction with computing device 132)

changes state as follows: first state 304→second state 306→third state 308→fourth state 310→fifth state 312→sixth state 314→second state 306, as shown in FIG. 3.

First state 304 includes initialization of state energy buffers, and it begins when a user powers on the signal processing system 100. In order to compare energies of different states, a continuous sum is determined over a time window of length $N_e$. Thus, the first state 304 enables the initial sum to complete from power-up and is never reentered.

Also, in an exemplary implementation, the second state 306 includes initialization of the signal frequency and bandwidth. Once each state's summed energy is computed, a maximum value thereof is determined in S clocks and an initial tracking frequency $f_0$ together with initial bandwidth $BW_{init}$ are computed using the linear relationship between the states and their corresponding frequencies. This initiates the tracking frequency and bandwidth that is input to the tunable tracking filters of filtering subsystem 207 (see FIG. 2), offset appropriately.

Further, in an exemplary implementation, the third state 308 includes initialization of the filter output buffers. In order to compare filter output energies from all the tracking filters of filtering subsystem 207 over a time window of length $N_f$ with the initial frequency and bandwidth settings, the third state 308 waits $N_f$ sample times so that the summed energies accurately reflect the effects of the frequency and bandwidth that are set.

Further, in an exemplary implementation, the fourth state 310 includes searching the delayed signal. After accurate filter output energies are acquired, the frequency and bandwidth updates can be computed correctly. This fourth state 310 initiates the tracking loop. To do so, the fourth state 310 further includes switching to a delayed sample from the sample buffer of length $N_s$ and attempts to pull in the signal until a signal presence indicator is equal or greater than a predetermined threshold. If the signal presence indicator does not equal or exceed the predetermined threshold, the fourth state 310 transitions back to the second state 306 after a search counter expires.

Furthermore, in an exemplary implementation, the fifth state 312 includes tracking the delayed signal. After the signal is detected, it is continually tracked from the delay sample buffer as long as the signal is present, or until a track timeout occurs. The track timeout is used by the BSS control system including, without limitation, at least one of the BSS control module 196 and the computing device 132, to keep the tracking filter resources of filtering subsystem 207 from being kept busy by long communications signals (i.e., which would prevent those filtering resources from being utilized for more important radar signals). A track timeout event during the fifth state 312 causes a transition back to the second state 306. However, if the signal presence indicator is equal to or less than the predetermined threshold, the fifth state 312 transitions to the sixth state 314.

Moreover, in an exemplary implementation, the sixth state 314 includes holding the delayed signal. When the tracked signal is no longer present (i.e., no longer detected by sensor 103), the hold state of the sixth state 314 prevents updating of the frequency and starts a hold timer. If the signal presence indicator equals or is greater than the predetermined threshold, the sixth state 314 transitions back to tracking the delayed signal (i.e., fifth state 312). Otherwise, the hold timer will expire and the sixth state 314 transitions back to the second state 306.

The technological improvement that is the subject of this disclosure operates within the context of a denoising and BSS architecture as shown in FIG. 1. In particular, the method proposed herein is part of the BSS control module 196 that takes input from each BSS channel 200 and is able to inform the BSS subsystem about new frequencies and bandwidths that potentially contain signals of interest in order to more effectively use the limited BSS channel resources to find as many signals as possible, including those with low SNR that would ordinarily not trip a detection threshold.

Each BSS channel 200 tracks in frequency alone or in both frequency and bandwidth as shown in FIG. 2. In particular the BSS control information that is updated by the state machine is a vector with the following information:

(time; frequency; bandwidth; energy) at each point in time that the state machine updates these values for its tracking filters.

The BSS subsystem has an overall control of all channels that uses a periodic time-frequency covering map to decide where to place the center frequency and bandwidth of each filter over all time by taking in energy measurements from existing filter settings and adaptively updating continuously while maintaining a coverage in time and frequency that is as complete as possible. The output of the BSS channel state machine 208 includes an updated center frequency and bandwidth to initialize and control the filters 207 during search, track and hold states. The BSS control information represents passing the frequency, bandwidth, signal energy (and their implied time stamp) to the methods described below in information vectors as given above.

In accordance with one embodiment of a method for BSS filter resource management, the BSS subsystem is based on the architecture shown in FIGS. 1 and 2. This architecture has a number of important aspects, including a number of BSS channels 200 comprising tunable filters, each of which produces a (presumed) unique separated denoised signal at its output, and an overall BSS control module 196. The maximum number of separated signals at any given time is limited by the number (i.e., B) of such BSS channels 200. Using the technology disclosed herein, each of these channels will have the following capabilities: (1) the ability to track both the signal's frequency and bandwidth so that it produces a continuous and undistorted output for each continuous input signal; (2) the ability to detect when a signal is no longer being detected and stop producing output; (3) the ability to then find another non-separated signal to separate; (4) the ability to not duplicate a separated signal occurring on another channel; and (5) the ability to find and separate all signals with detectable SNR that are present if enough filter resources are available.

In accordance with the technique for initializing each BSS channel 200 disclosed above, the cueing of the signal denoising module 118 provides the starting frequency and bandwidth of each BSS channel 200. However, there are typically far more signals than state energy starting points as well as available BSS channels 200. Thus the BSS channels 200 must be managed so as to use their limited filter resources to find, track and separate as many signals of interest as possible.

Figure 4:
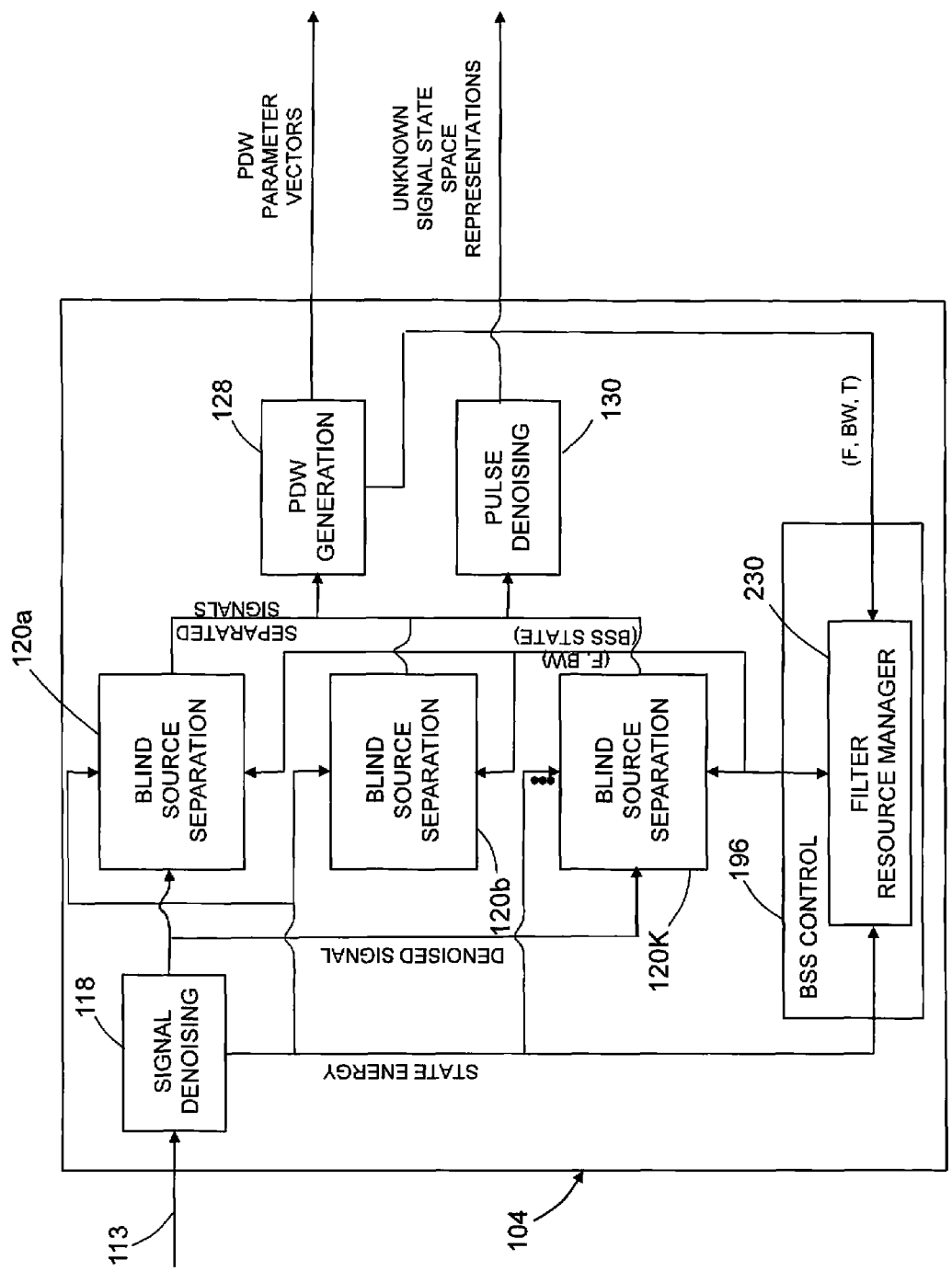
FIG. 4 is a block diagram showing a denoising and BSS architecture incorporated in a pre-processor in accordance with one embodiment, which pre-processor may be substituted into the signal processing system depicted in FIG. 1.

FIG. 4 is a block diagram showing a denoising and BSS architecture of a pre-processor 104 in which the BSS control module 196 has a filter resource manager 230 which performs a filter resource management subfunction in accordance with one embodiment. As seen in FIG. 4, the filter resource manager 230 receives state energy signals from the signal denoising module 118 and also receives PDW parameter vector signals from the PDW generation module 128. Each PDW parameter vector signal contains data representative of characteristics of interest of detected radar signals such as frequency, bandwidth, time of arrival, etc. In addition, the filter resource manager 230 communicates with the BSS channel state machines inside respective BSS modules 120a, 120b, ..., 120K). More specifically, the filter resource manager 230 receives signals from the BSS channel state machines representing parameters of respective states of the BSS modules and sends signals representing those parameters, e.g., center frequencies and bandwidths, to the BSS channel state machines 208.

Figure 5:
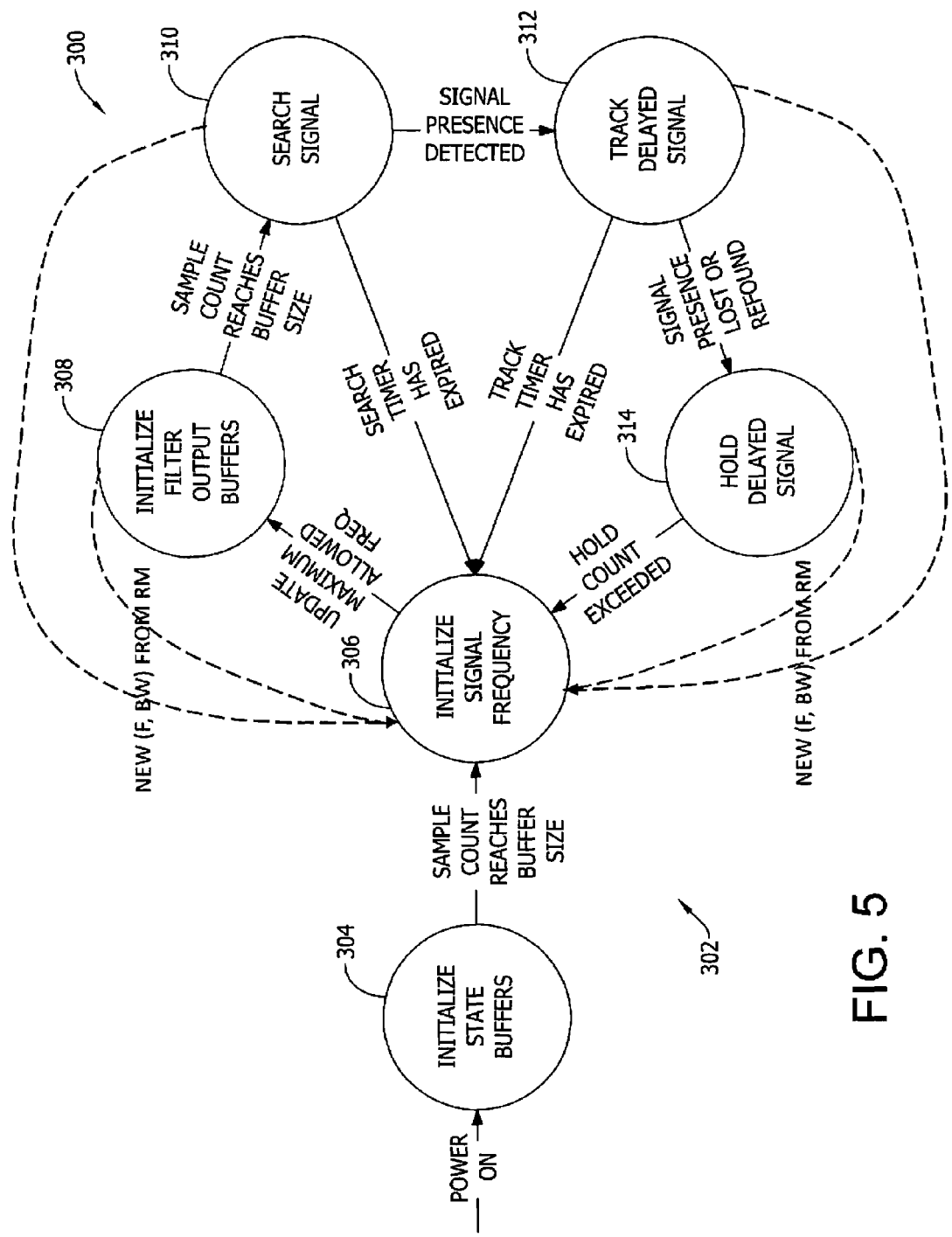
FIG. 5 is a diagram identifying states and transitions of a BSS channel state machine in accordance with one embodiment.

The state diagram shown in FIG. 3 is, modified when used with the BSS filter resource manager 230 shown in FIG. 4 to allow state transitions in addition to the ones shown. FIG. 5 is a diagram identifying states and transitions of a BSS channel state machine 208 in accordance with one embodiment. Specifically, the new transitions shown in FIG. 5 include direct transitions out of states 308, 310, 312 and 314 back into state 306. In addition, state 306 sets the frequency and bandwidth per the resource management request from the resource manager (RM), overriding the information from the denoiser energy.

Figure 6:
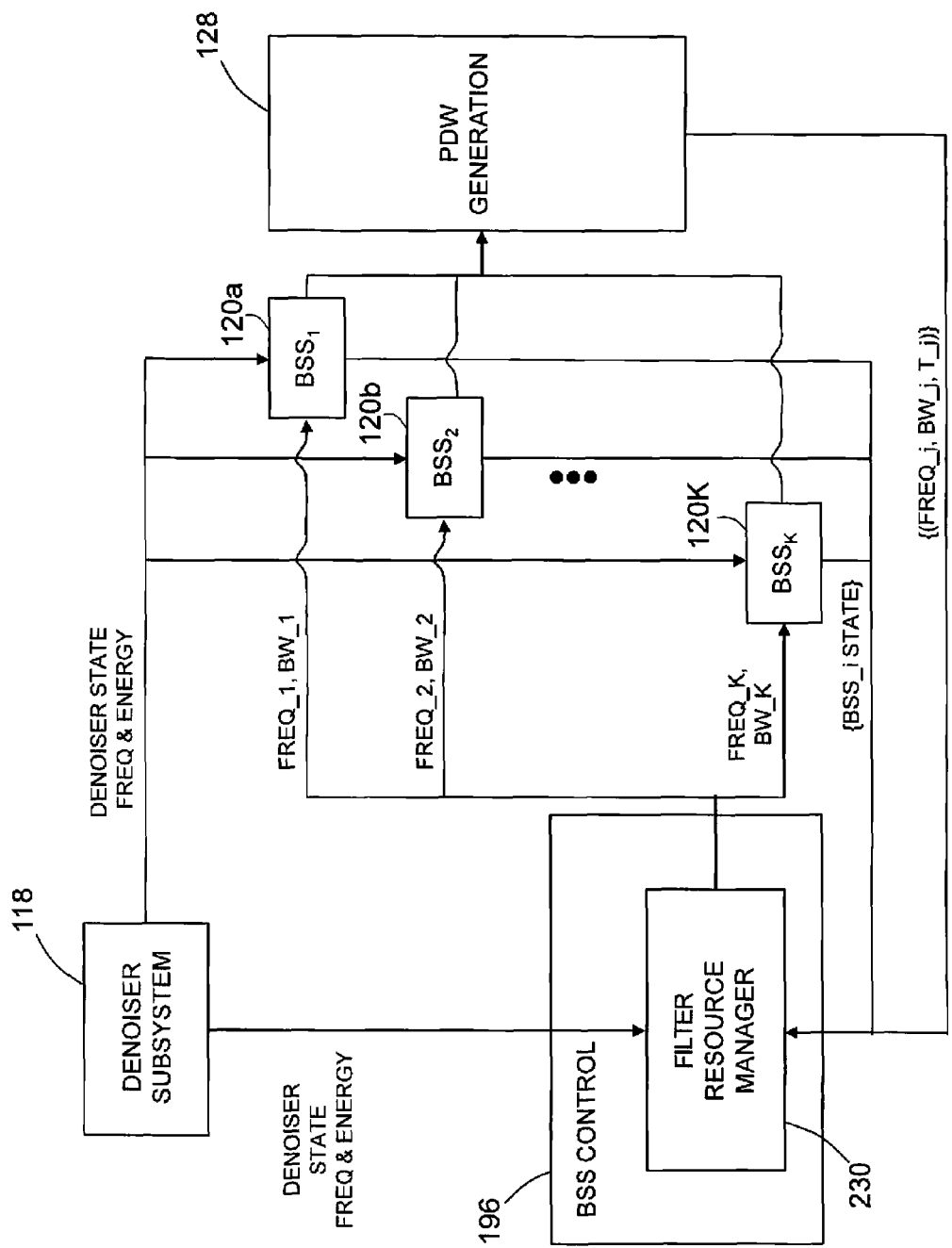
FIG. 6 is a block diagram showing the flow of information that is part of a process of filter resource management in accordance with one embodiment.

FIG. 6 is a block diagram showing the flow of information that is part of a process for filter (or BSS channel) resource management in accordance with one embodiment. The signal denoising module 118 provides (through its internal state energies) a set of initial frequencies where there is guaranteed energy present nearby. This information is provided to the filter resource manager 230 and to the BSS modules 120a, 120b, ..., 120K. Each BSS module uses the received frequency and energy as a starting point to find the signal (and its bandwidth). Each BSS module will track its signal until either the track counter times out or the signal goes away. At that point, each of the K BSS modules would then get new frequency and bandwidth starting points (i.e., Freq_1,BW_1; Freq_2,BW_2; ..., Freq_K,BW_K) from the filter resource manager 230. As previously mentioned, the filter resource manager 230 receives PDW parameter vector signals {(Freq_j,BW_j,T_j)} from the PDW generation module 128 and signals {BSS_i State} from the BSS channel state machines representing the states (i.e., frequency, bandwidth and other parameters) of the BSS modules 120a, 120b, ..., 120K.

Without the filter resource management subfunction described herein, any time the K BSS channels are all busy, no other new signals can be tracked and separated. But there will typically be many more than K such signals present, implying that these other signals would be missed during this time when all the BSS channels are otherwise occupied. To solve this problem, the BSS control function is provided with a filter resource management subfunction.

Figure 7:
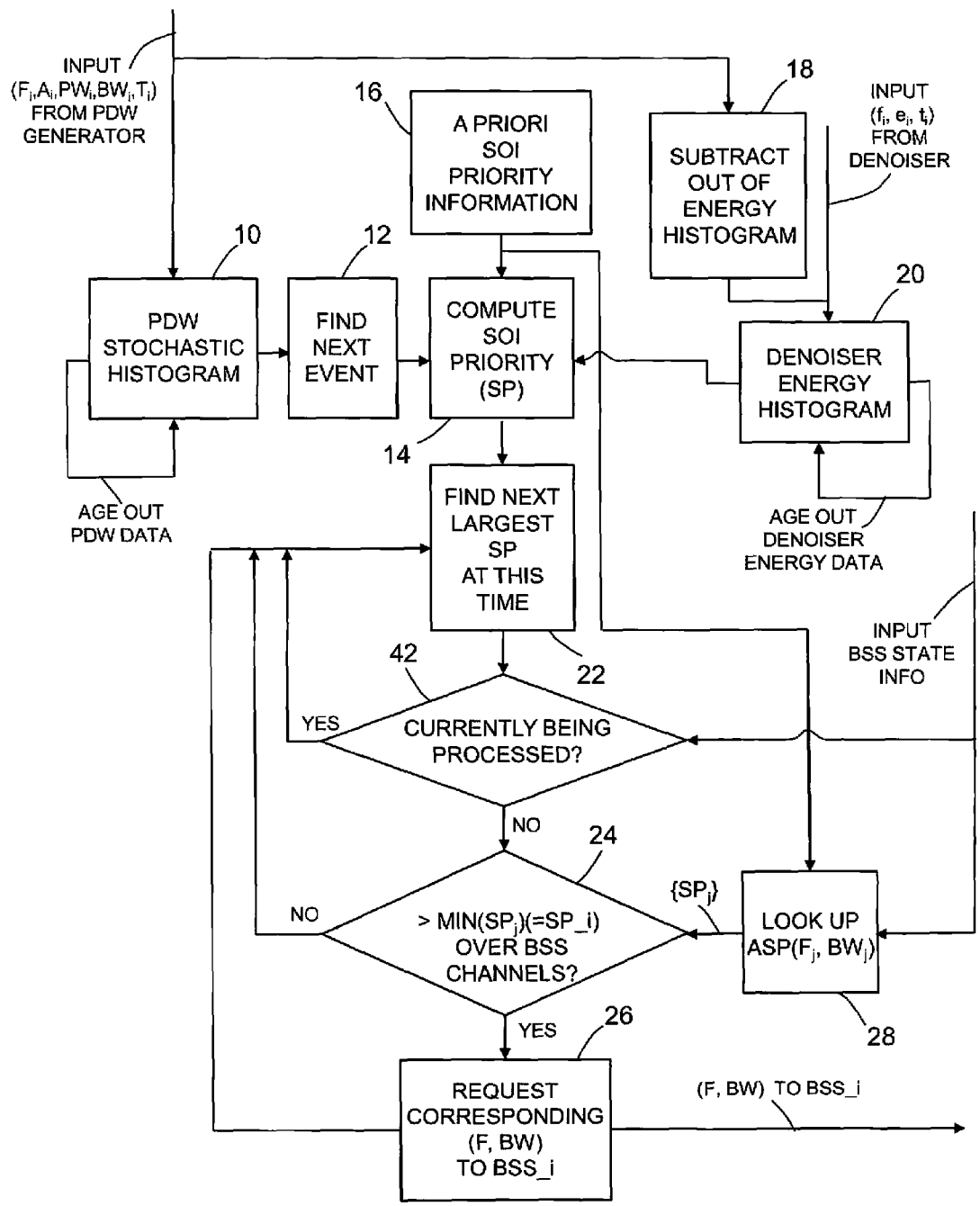
FIG. 7 is a flowchart identifying data processing modules and steps of a method for filter resource management in accordance with a first embodiment.

In accordance with a first embodiment, the filter resource manager 230 operates as shown in the block diagram seen in FIG. 7. The filter resource management subfunction updates a quantity called Signal of Interest (SOI) priority (hereinafter "SP"). FIG. 7 identifies the following data processing modules: PDW stochastic histogram 10 (which is a consecutive histogram); a priori SOI priority information 16 (which information may be organized as a look-up table); and denoiser energy histogram 20. These data processing modules, which also include non-transitory tangible computer-readable storage media (i.e., memory) for storing and updating data of the BSS system so that an overall processing picture is kept up to date, are described below in detail.

A suitable PDW stochastic histogram 10 is described in detail in U.S. Pat. No. 9,046,593 and in U.S. patent application Ser. No. 15/271,512 (called a "stochastic frequency/time-of-arrival histogram" in the latter). This stochastic histogram consists of a frequency histogram in one dimension and a time-of-arrival diffogram in the other dimension This PDW stochastic histogram 10 takes PDW information and, after matching information such as pulse width and frequency, computes a difference in time of arrival between consecutive pulses and from that creates a histogram with lumps that build up over time at the pulse repetition intervals (PRIs) of the various radar signals (segregated by frequency) that are being received. This histogram will have a standard aging process as described in U.S. Pat. No. 9,046,593 to keep the PDW information up to date. Each histogram value can be denoted by $P_{f,\Delta t}$, where f varies over all frequencies being received and $\Delta t$ varies over all the bins of the PDW stochastic histogram 10 representing the difference in time between two related PDWs (in other words, the bins represent the PRIs). Note that to this basic frequency diffogram, additional dimensions can be added beyond these two. Parameters such as amplitude, bandwidth, modulation, pulse width and other pulse parameters are examples of such additional dimensions to this histogram.

The a priori SOI priority information 16 is information captured in a single SOI priority number between 0 and 1 and denoted by ASP( ) for each piece of information that is specific to the operation of a system that uses the blind source separation subsystem at a particular time and place and in a particular application. Typically this would be in the form of meta-PDW data stored in a database. For example, it could include frequencies that represent communications signals that should not be examined by the BSS system at all. In this case, there would be a set of values $ASP(f_i; f_j)$ for each of a set of frequency ranges, each range being from $f_i$ to $f_j$. These would have a value of 0. Or a priori SOI priority information 16 could comprise high-priority frequencies for radars that must be examined when they occur due to their threat. In this case, ASP=1 for example. Values of ASP that are unspecified would be equal to a nominal value of 0.5, representing a priority value halfway between "do not process" and "process at the highest priority" or between 0 and 1. In general, the ASP values can include any pulse parameters to specify particular probabilities such as pulse width, PRI, modulation type, etc. This is used to represent any type of signal that it known beforehand. The a priori SOI priority information 16 contains fixed information that is set up by the user of the system before operation (and then changed under user control whenever conditions change, requiring the user to intervene). These changes could also be under control of some other system on the aircraft, platform or the ground.

The denoiser energy histogram 20 adds the current energy present in all state outputs $(f_i, e_i, t_i)$ of the denoiser to a histogram and has a standard aging process as described in U.S. Pat. No. 9,046,593 to keep the denoiser energy estimate up to date. Each histogram value denoted by $D_s$ corresponds to a respective denoiser state s. State s is an index (e.g., an integer s=1, 2, 3, ..., S) applied to the denoiser state outputs. Each state of the denoiser (and its corresponding energy) is associated with a respective frequency range or band, so the denoiser state s can be determined by data processing module 40 for each PDW event because the event has an associated frequency in that frequency range or band.

Each BSS channel state machine 208 stores the current BSS state information from all of the K BSS modules. This includes the current center frequency and bandwidth of each BSS channel, what state each BSS channel is in, the state of each timer, etc. This also includes the ASP value, denoted as $SP_i$, that is associated with this state. Note that each BSS channel could independently update this ASP value depending on current state information if desired. Note also that the $SP_i$ value for channel i would be initially set to a standard value of $ASP_i(init)$ coming from the a priori SOI priority information 16 if the BSS channel initiated the tracking from the denoiser data.

Next, the data processing modules depicted in FIG. 7 which perform the filter resource management subfunction will be described.

1. Data processing module 18 subtracts the energy of PDW information vectors ($F_i$, $A_i$, $PW_i$, $BW_i$, $T_i$, etc.) out of the denoiser energy histogram 20. Data processing module 18 takes the PDW data and computes its energy based on amplitude ($A_i$) squared times pulse width ($PW_i$) and subtracts this energy out of the denoiser energy histogram 20. This process ensures that the denoiser energy histogram 20 represents uncategorized energy, instead of total energy. This then leads to a decision process (see below) based on an SOI priority that reflects both that of the uncategorized energy that should be examined and the already categorized signals.

2. Data processing module 12 finds the next event using any of the event processing methods described in U.S. Pat. Nos. 9,046,593 and 9,430,688. This process successively associates and extracts PDW and state information based on the height of the histogram for that information. Each such event includes a number of PDW data items that should correspond to a single emitter and therefore should be associated with each other (i.e., collected) because of their closely related parameters. Each event is denoted by $E_e$, where e varies over the list of events.

3. Data processing module 14 computes the SOI priority (SP) value. This module processes the event data from the PDW stochastic histogram 10 and labels each event by its SOI priority value, which is a number denoted by $SP_e$ that is associated with event $E_e$. The value is computed using the a priori SOI priority information 16, which may be in the form of a look-up table. In accordance with one embodiment, this value is computed using both the event $E_e$ information and the denoiser energy histogram value from the denoiser energy histogram 20 for the denoiser state s associated with the event. The computation of $SP_e$ will now be described in mathematical terms. Let $ASP(E_e)$ be the a priori SOI priority value for the PDWs within the event $E_e$. This is computed by using the event characteristics (frequency, amplitude, $\Delta T$ (i.e., PRI), pulse width, bandwidth, etc.) and the ASP look-up table 26 (i.e., a priori SOI priority information) to look up the priority $ASP(E_e)$. Similarly, let s be the denoiser state corresponding to the event $E_e$, i.e., the frequency of event $E_e$ is in the frequency range associated with denoiser state s. Then let $D_s$ be the denoiser energy histogram value for denoised signals having a frequency in the frequency range of denoiser state s. Then let $ASP(D_s)$ be the a priori SOI priority value computed from the energy $D_s$ in the denoiser energy histogram 20 in the frequency range of the denoiser state s. (Notes: Each denoiser state s has a respective frequency range. A denoiser state contains energy at a given time if there was received energy in that state's frequency range or band at that time. Each denoiser state has an a priori SOI priority value that reflects the probability that radar signals of importance would be transmitting in that frequency range.) Then $SP_e$ is set to the maximum of $ASP(E_e)$ and $ASP(D_s)$, i.e., $SP_e = \max(ASP(E_e); ASP(D_s))$. Thus the priority reflects a need by a blind source separator to examine both uncategorized energy as well as a prevalence of previously categorized PDWs with priority characteristics. In other words, a high-priority event is caused by either or both of two competing reasons: (1) the event is high priority if it has high-priority characteristics ($ASP(E_e)$ is high); and/or (2) it is high priority if the priority $ASP(D_s)$ of uncategorized signal energy corresponding to the event $E_e$ (that was initially tracked from state s) is high. To expand on item (2), what this means is that the frequency of the PDWs in the event lies in the frequency range of the denoiser state s and there is still a lot of uncategorized energy there (meaning there are many fewer PDWs formed versus the energy received in the relevant frequency range). The next section covers data processing module 14 in more detail.

4. After each SOP priority SP) value has been computed, it is stored. The SP values are stored in a manner such that they are listed in order from highest to lowest values. During each instantiation, the data processing module 22 finds the next largest $SP_e$ in the list at this time, successively pulling out the events with SP values in order from highest to lowest. While this is going on, the data processing module 12 receives a signal indicating it should find the next event, following which the data processing module 14 will compute a new SP value for that next event and so forth.

5. The data processing module 42 then determines whether the frequency associated with the next largest $SP_e$ is currently being processed (i.e., separated and tracked) by any one of the multiplicity of channels or not. If the frequency associated with the next largest $SP_e$ is currently being processed, then it need not be compared to the current minimum SP value in data processing module 24.

6. If the frequency associated with the next largest $SP_e$ is not currently being processed, then the data processing module 24 compares the next largest $SP_e$ value with a current minimum SP value identified from the SP values of all BSS channels. More specifically, the data processing module 24 tests the next largest $SP_e$ value against the minimum SP value for all BSS channels.

7. To enable the foregoing comparison, the BSS channel state machine 208 (see FIG. 2) for each BSS channel outputs BSS state data, including center frequency and bandwidth values ($F_j$, $BW_j$), to the filter resource manager 230 (see FIG. 6), which values are stored in a current BSS state database (not shown). The data processing module 28 then uses those frequency and bandwidth values to look up the a priori SOI priority value $ASP(F_j, BW_j)$ for each BSS channel j in the look-up table that lists the a priori SOI priority information 16.

8. Returning to data processing module 24, the minimum $\min(SP_j)$ of $ASP(F_j, BW_j)$ values over all BSS channels (which minimum corresponds to BSS channel i) is then set equal to SP_i. The next largest $SP_e$ value is then compared to SP_i. If the next largest $SP_e$ value is larger than SP_i, the data processing module 24 will trigger the sending of a message (i.e., request) to that BSS channel, causing the channel to potentially abandon the currently tracked signal and start on a new one. Other criteria can be added to this test by having the BSS channels adjust their SP values depending on current information. If not larger than the minimum, the data processing module 24 will test the next largest SP, value.

9. In response to the trigger signal from the data processing module 24, the data processing module 26 sends a request identifying desired filter parameters (f, BW) to the specific BSS channel i, i.e, BSS_i. indicated in FIG. 7. This frequency and bandwidth request is sent to BSS channel i that has the lowest (i.e., minimum) SP value (hence the new signal to be tracked has higher priority than the current separated signal in that channel).

10. The center filter of the BSS channel is then tuned to the frequency identified in the request. That frequency is the frequency associated with the event which had the lowest signal-of-interest priority value greater than the minimum signal-of-interest priority value for all BSS channels. (Then the next largest signal-of-interest priority value is tested, as stated above.)

To summarize, the BSS state includes frequency and bandwidth and these parameters are used to look up respective ASP values for each BSS channel. Since the BSS channels keep updating the frequency and bandwidth data, this can potentially change over time as tracking continues. This is used to decide which channel is doing the "least important" work. It is different from the $SP_e$ values in timing and processing. PDWs (based on events) are created after the BSS channel tracks the signal, so these are delayed in time and are processed more accurately. In contrast, the $ASP(F_j, BW_j)$ values for each BSS channel j are "immediately available" because the decision must be made quickly.

Figure 8:
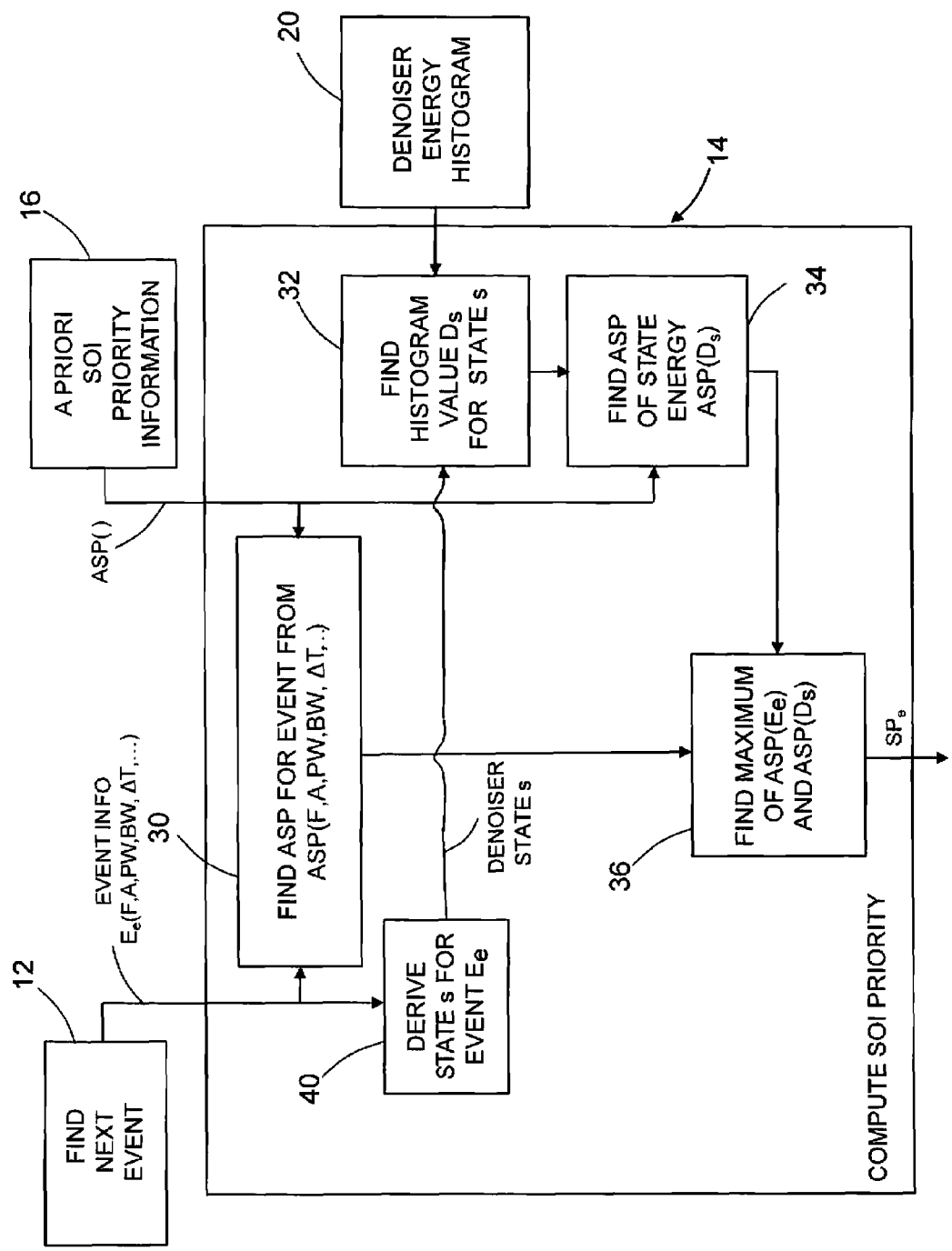
FIG. 8 is a flowchart identifying steps used to compute an SOI priority (SP) value for each event that occurs in the PDW stochastic histogram identified in FIG. 7.

FIG. 8 identifies steps used to compute an $SP_e$ value for each event $E_e$ that occurs in the PDW stochastic histogram 10 in accordance with the first embodiment. The data processing module 14 processes the event data from the PDW stochastic histogram 10 and labels each event by its SOI priority, which is a number denoted by $SP_e$ that is associated with event $E_e$. The data processing module 14 takes three types of input: (a) data representing event $E_e$, (b) a priori SOI priority information 16 from the ASP look-up table, and (c) information from the denoiser energy histogram 20. Each process block inside data processing module 14 is described below:

1. Find $ASP(E_e)$ (process 30): The a priori SOI priority value $ASP(E_e)$ for event $E_e$ is computed by looking up a priori SOI priority information 16 contained in a parameter-based stored table, wherein the pulse parameters (frequency, ΔT (i.e., PRI), pulse width, bandwidth, etc.) of the PDWs are used to look up the priority value.

2. Derive denoiser state s for event $E_e$ (process 40): Since each denoiser state s is associated with a respective frequency range, a frequency identified in the PDW information vectors for an event $E_e$ can be used to derive the denoiser state s corresponding to that event $E_e$. Process 40 outputs the denoiser state s for event $E_e$.

3. Find histogram value $D_s$ (process 32). Process 32 receives the denoiser state s for event $E_e$ from process 40 and uses that information to look up the current amount of energy for denoiser state s in the denoiser energy histogram 20. The current denoiser energy for state s is denoted by $D_s$. [As previously mentioned, $D_s$ is the denoiser energy of denoised signals in the frequency range of state s, while the frequency of event $E_e$ is in the same frequency range.]

4. Find $ASP(D_s)$ (process 34). The a priori SOI priority value for state s is computed by looking up a priori SOI priority information 16 for denoiser signal energy $D_s$ in the frequency range of state s. This priority value is denoted by $ASP(D_s)$.

5. Find maximum (process 36). The priority value $SP_e$ for the event $E_e$ is then determined by taking the maximum of the values $ASP(E_e)$ and $ASP(D_s)$, i.e., $SP_e = \max(ASP(E_e); ASP(D_s))$. This priority reflects a consideration of both a prevalence of previously categorized PDWs with priority characteristics and an amount of uncategorized energy.

To explain the rationale in non-mathematical terms, a high-priority event occurs for either or both of two competing reasons: (1) the event is high priority if it has high-priority characteristics (i.e., $ASP(E_e)$ is high); and/or (2) it is high priority if the priority $ASP(D_s)$ of uncategorized signal energy (that was initially tracked from state s) is high. To expand on item (1), if high-priority PDWs have been found, they should continue to be focused on both to get better information over time for better identification and to determine when the radar signal goes away. To expand on item (2), what this means is that the frequency of the PDWs in the event lie in a frequency range of a state $D_s$ which is high priority and there is still a lot of uncategorized energy there (meaning there are many fewer PDWs formed versus the energy received in the relevant frequency range) and so the BSS channel should be configured (e.g., by choosing in real time the center frequency and bandwidth of the filter in the BSS module 120) to try to determine what this uncategorized energy consists of.

In accordance with one implementation of the first embodiment, a method for performing blind source separation of signals comprises the following processes: receiving signals; denoising the signals received using a denoising module; separating the denoised signals as a function of frequency using respective filters of a multiplicity of channels; generating first information vectors comprising respective data sets of parameter values of separated signals, wherein each data set of parameter values making up an information vector of the first information vectors comprises a frequency, an amplitude and a pulse width of a respective separated signal separated by the filter of a respective channel; adding the data sets of parameter values of the first information vectors to a first histogram; generating second information vectors comprising respective data sets of parameter values of denoised signals, wherein each data set of parameter values making up an information vector of the second information vectors comprises a frequency range and an energy of a respective denoiser state; adding the data sets of parameter values of the second information vectors to a second histogram; computing respective energies of the first information vectors; subtracting the computed energies from the energies of associated denoiser states in the second histogram; finding an event having an associated frequency in the first histogram; associating a signal-of-interest priority value with the found event; determining a current minimum signal-of-interest priority value associated with one channel of the multiplicity of channels; comparing the signal-of-interest priority value associated with the found event to the current minimum signal-of-interest priority value; sending a request to the one channel to tune its filter with the frequency associated with the found event in response to the signal-of-interest priority value associated with the found event being greater than the current minimum signal-of-interest priority value; and tuning the filter of the one channel with the frequency associated with the found event. In accordance with some embodiments, the step of associating a signal-of-interest priority value with the found event comprises setting the associated signal-of-interest priority value equal to a maximum of a first a priori signal-of-interest priority value corresponding to the frequency associated with the found event and a second a priori signal-of-interest priority value corresponding to the denoiser energy of a denoiser state having the frequency associated with the found event.

Although the first embodiment described above comprises a PDW stochastic histogram 10 and a denoiser energy histogram 20, these collections of data do not technically have to be histograms. In addition, in accordance with alternative embodiments, these collections of data could be independent collections of data that are used separately, not together. In other words, the filter resource manager could operate with only collections of related PDWs created by some method. Or it could operate with only denoiser energy information. Or it could operate with both, as disclosed in detail above. In the case of the first embodiment depicted in FIGS. 7 and 8, a maximum operation is employed. In alternative embodiments, collections of denoiser energy data can be used (referred to below as the second embodiment) or collections of PDWs (referred to below as the third embodiment) can be used to manage filter resources of a BSS system.

Figure 9:
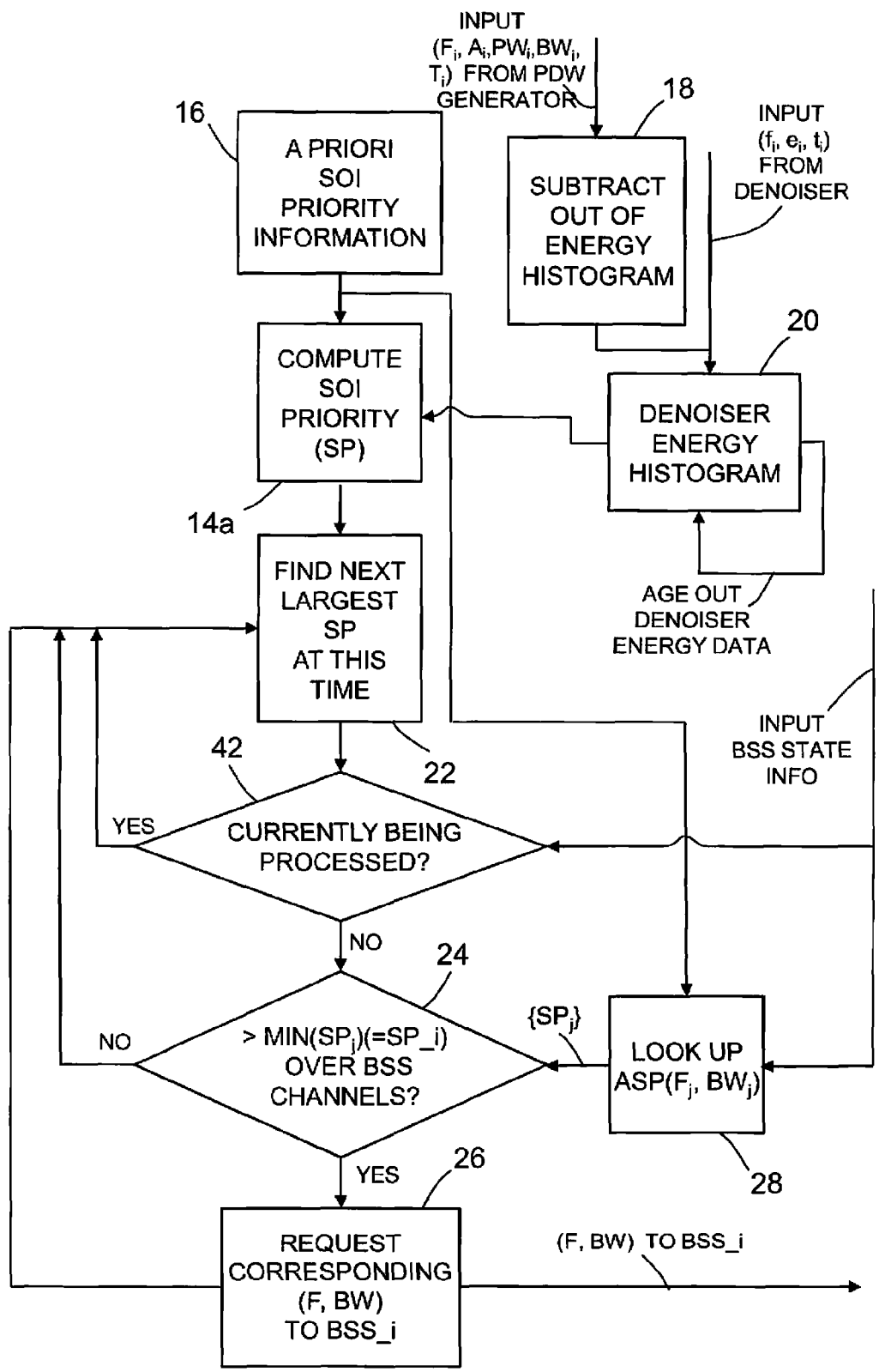
FIG. 9 is a flowchart identifying data processing modules and steps of a method for filter resource management in accordance with a second embodiment.

FIG. 9 is a flowchart identifying data processing modules and steps of a method for filter resource management in accordance with a second embodiment in which a denoiser energy histogram 20 is used and a PDW stochastic histogram is not used to manage filter resources. The blocks in FIG. 9 having reference numbers which are the same as reference numbers used in FIG. 7 have the same functionality as described above. In this second embodiment, data processing module 14a computes the SOI priority (SP) value $SP_e$. The value is computed using the a priori SOI priority information 16. This $SP_e$ value is computed using the denoiser energy histogram values (and not using the PDW stochastic histogram 10) for state s which are collected in the denoiser energy histogram 20.

Figure 10:
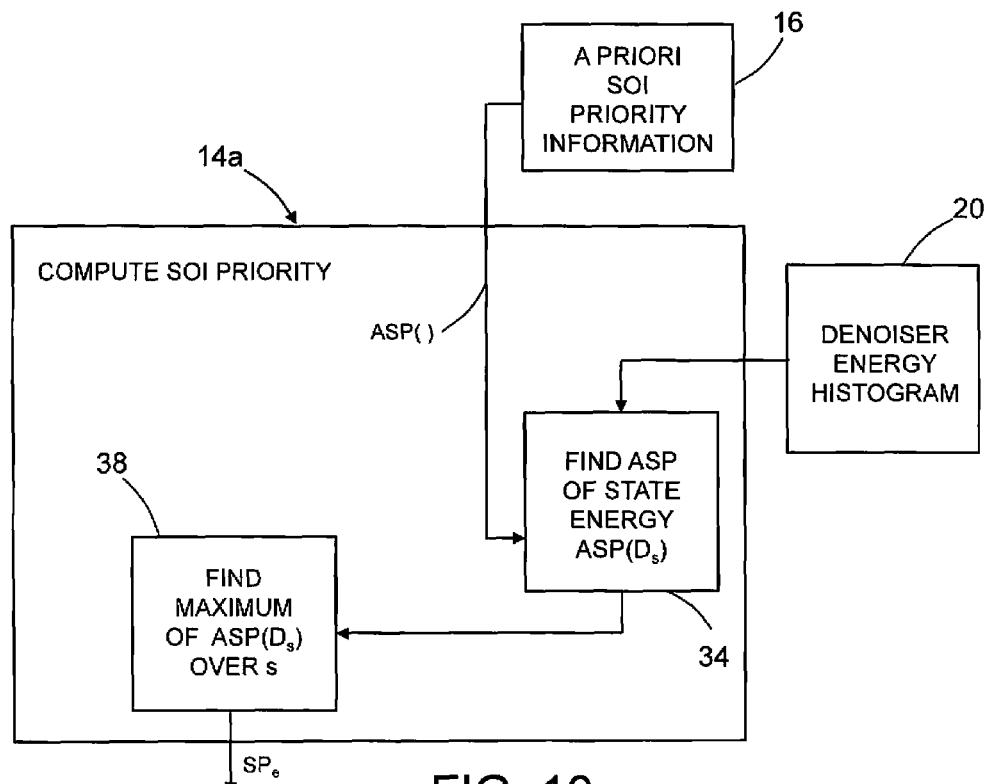
FIG. 10 is a flowchart identifying steps used to compute an SOI priority (SP) value for each denoiser energy collected in the denoiser energy histogram identified in FIG. 9.

FIG. 10 is a flowchart identifying steps used to compute $SP_e$ in accordance with the second embodiment depicted in FIG. 9. The $ASP(D_s)$ values are computed (process 34) by looking up a priori SOI priority information 16 for denoiser signal energies currently in the denoiser energy histogram 20. Then the maximum $ASP(D_s)$ value is found for state s. (process 38). The $SP_e$ value output by the data processing module 14 will be equal to that maximum $ASP(D_s)$ value. This value will be placed in an ordered list and the largest $SP_e$ value in that list will be compared with the current minimum SP value for BSS channels as previously described.

Figure 11:
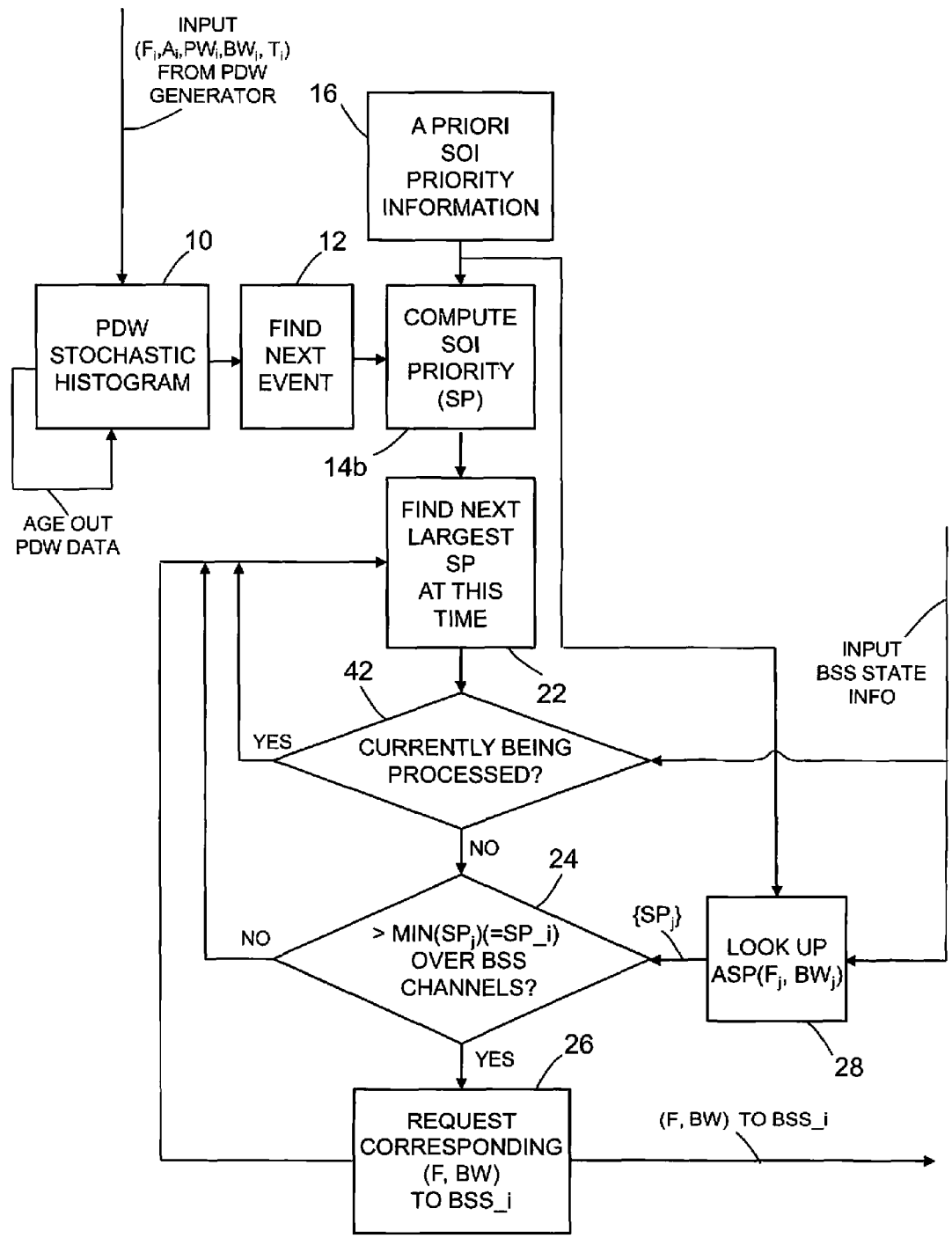
FIG. 11 is a flowchart identifying data processing modules and steps of a method for filter resource management in accordance with a third embodiment.

FIG. 11 is a flowchart identifying data processing modules and steps of a method for filter resource management in accordance with a third embodiment in which the PDW stochastic histogram 10 is used to manage filter resources and the denoiser energy histogram is not used. The blocks in FIG. 11 having reference numbers which are the same as reference numbers used in FIG. 7 have the same functionality as described above. In this third embodiment, data processing module 14b computes the $SP_e$ value for each event using the a priori SOI priority information 16. This $SP_e$ value is computed using the PDW information collected in the PDW stochastic histogram 10 for that event.

Figure 12:
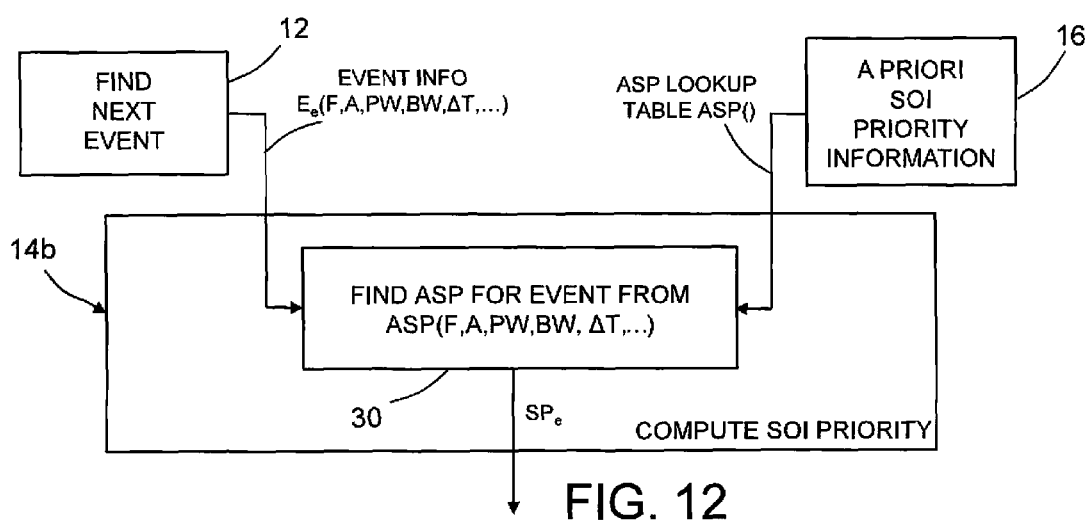
FIG. 12 is a flowchart identifying steps used to compute an SOI priority (SP) value for each event that occurs in the PDW stochastic histogram identified in FIG. 11.

FIG. 12 is a flowchart identifying steps used by data processing module 14b compute the $SP_e$ value for each event found by data processing module 12. This value will be output and stored in an ordered list and the largest $SP_e$ value in that list will be compared with the current minimum SP value for BSS channels as previously described.

Blind source separation systems typically have a set of filters (often in hardware) that is limited in processing ability. These filters typically have one or two main parameters, including center frequency and bandwidth. There are other parameters, such as number of filter zeros and poles, but these are often fixed. The problem is to take a fixed set of tunable filters with one or more parameters (such as center frequency and bandwidth) and separate as many important signals as possible from a wideband signal collection in real time. Existing solutions base the choice of center frequency and bandwidth on the current highest unprocessed signal energy that is detected. This leads to an inefficient use of such hardware and the likely possibility of missing pulsed signals. In addition, the channel that outputs a particular signal is not necessarily consistent from one pulse to another. The filter resource manager disclosed in detail above operates by deciding where to place the center frequency and bandwidth of each filter at each time based on a priori SOI priority information.

Certain systems, apparatus, applications or processes are described herein as including a number of modules. A module may be a unit of distinct functionality that may be implemented in software, hardware, or combinations thereof. By way of illustration, the histogram generator having a data input adapted to receive one or more of a signal and/or a variable and configured to form an original N-dimensional histogram function from one or more of N-dimensional signal parameter data for the signal for extracting characteristic parameters of the signal can be implemented in software, hardware, or combinations thereof. When the functionality of a module is performed in any part through software, the module can include a non-transitory tangible computer-readable storage medium. The modules may be regarded as being communicatively coupled.

While blind source separation systems have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms "processor" and "computing device".

The process claims set forth hereinafter should not be construed to require that the steps recited therein be performed in alphabetical order (any alphabetical ordering in the claims is used solely for the purpose of referencing previously recited steps) or in the order in which they are recited. Nor should they be construed to exclude any portions of two or more steps being performed concurrently or alternatingly.

The invention claimed is:

1. A method for performing blind source separation of signals, comprising:
   (a) receiving signals;
   (b) denoising the signals received using a denoising module;
   (c) separating the denoised signals as a function of frequency using respective filters of a multiplicity of channels;
   (d) generating first information vectors comprising respective data sets of parameter values of separated signals, wherein each data set of parameter values making up an information vector of the first information vectors comprises a frequency, an amplitude and a pulse width of a respective separated signal separated by the filter of a respective channel;
(e) collecting the data sets of parameter values of the first information vectors; and
(f) directing a filter of one channel of the multiplicity of channels to separate a particular frequency based on the collected data sets of parameter values of the first information vectors.

2. The method as recited in claim 1, further comprising:
(g) finding an event in the collected data sets of parameter values of the first information vectors, which found event is associated with the particular frequency;
(h) associating a signal-of-interest priority value with the found event;
(i) determining a current minimum signal-of-interest priority value associated with one channel of the multiplicity of channels; and
(j) comparing the signal-of-interest priority value associated with the found event to the current minimum signal-of-interest priority value,
wherein the one channel is directed to tune its filter with the particular frequency in response to the signal-of-interest priority value associated with the found event being greater than the current minimum signal-of-interest priority value.

3. The method as recited in claim 2, further comprising tuning the filter of the one channel to process the particular frequency.

4. The method as recited in claim 2, further comprising:
(k) determining whether any other channel of the multiplicity of channels is currently processing the particular frequency or not; and
(l) performing step (f) in response to a determination in step (k) that none of the multiplicity of channels are currently processing the particular frequency.

5. The method as recited in claim 2, further comprising:
generating second information vectors comprising respective data sets of parameter values of denoised signals, wherein each data set of parameter values making up an information vector of the second information vectors comprises a frequency range and an energy of a respective denoiser state;
collecting the data sets of parameter values of the second information vectors;
computing respective energies corresponding to the collected first information vectors; and
subtracting the computed energies corresponding to the collected first information vectors from the total energies of the collected second information vectors for each frequency range.

6. The method as recited in claim 5, wherein the step of associating a signal-of-interest priority value with the found event comprises setting the associated signal-of-interest priority value equal to a maximum of a first a priori signal-of-interest priority value corresponding to the particular frequency and a second a priori signal-of-interest priority value corresponding to a denoiser energy of a denoiser state having the particular frequency.

7. A method for performing blind source separation of signals, comprising:
receiving signals;
denoising the signals received using a denoising module;
separating the denoised signals as a function of frequency using respective filters of a multiplicity of channels;
generating first information vectors comprising respective data sets of parameter values of separated signals, wherein each data set of parameter values making up an information vector of the first information vectors comprises a frequency, an amplitude and a pulse width of a respective separated signal separated by the filter of a respective channel;
adding the data sets of parameter values of the first information vectors to a first histogram;
generating second information vectors comprising respective data sets of parameter values of denoised signals, wherein each data set of parameter values making up an information vector of the second information vectors comprises a frequency range and an energy of a respective denoiser state;
adding the data sets of parameter values of the second information vectors to a second histogram;
computing respective energies of the first information vectors;
subtracting the computed energies from the energies of associated denoiser states in the second histogram;
finding an event having an associated frequency in the first histogram;
associating a signal-of-interest priority value with the found event;
determining a current minimum signal-of-interest priority value associated with one channel of the multiplicity of channels; and
comparing the signal-of-interest priority value associated with the found event to the current minimum signal-of-interest priority value.

8. The method as recited in claim 7, further comprising sending a request to the one channel to tune its filter with the frequency associated with the found event in response to the signal-of-interest priority value associated with the found event being greater than the current minimum signal-of-interest priority value.

9. The method as recited in claim 8, further comprising tuning the filter of the one channel with the frequency associated with the found event.

10. The method as recited in claim 7, wherein the step of associating a signal-of-interest priority value with the found event comprises setting the associated signal-of-interest priority value equal to a maximum of a first a priori signal-of-interest priority value corresponding to the frequency associated with the found event and a second a priori signal-of-interest priority value corresponding to the denoiser energy of a denoiser state having the frequency associated with the found event.

11. The method as recited in claim 7, further comprising determining whether the frequency associated with the event is currently being processed by any one of the multiplicity of channels or not.

12. The method as recited in claim 7, wherein the event finding uses a technique selected from the following group: a mean above mean technique and a barcode tracking technique.

13. The method as recited in claim 7, wherein the first histogram is a data array comprising a respective set of frequency bins for each frequency of a plurality of frequencies, the frequency bins in each set of frequency bins containing energy information for signals having respective times of arrival to form a respective diffogram.

14. A method for performing blind source separation of signals, comprising:
(a) receiving signals;
(b) denoising the signals received using a denoising module;

(c) separating the denoised signals as a function of frequency using respective filters of a multiplicity of channels;

(d) generating information vectors comprising respective data sets of parameter values of denoised signals, wherein each data set of parameter values making up an information vector comprises a frequency range and an energy of a respective denoiser state;

(e) collecting the data sets of parameter values of the information vectors; and (f) directing a filter of one channel of the multiplicity of channels to separate a particular frequency based on the collected data sets of parameter values of the information vectors.

15. The method as recited in claim 14, further comprising:

(g) finding a maximum signal-of-interest priority value corresponding to one denoiser state of the respective denoiser states associated with the particular frequency;

(h) determining a current minimum signal-of-interest priority value associated with one channel of the multiplicity of channels; and (i) comparing the maximum signal-of-interest priority value to the current minimum signal-of-interest priority value, wherein the one channel is directed to tune its filter with the particular frequency in response to the maximum signal-of-interest priority value associated with the found event being greater than the current minimum signal-of-interest priority value.

16. The method as recited in claim 15, further comprising tuning the filter of the one channel to process the particular frequency.

17. A system for processing received signals, comprising:
a signal denoising module;
a multiplicity of channels communicatively coupled to the signal denoising module, each channel comprising a respective filter and respective channel state machines for configuring the filters to separate denoised signals as a function of frequency;
a control module communicatively coupled to the channel state machines of the multiplicity of channels; and
a pulse descriptor words (PDW) generation module communicatively coupled to the multiplicity of channels and to the control module, wherein the pulse descriptor words (PDW) generation module is configured to generate first information vectors comprising respective data sets of parameter values of separated signals, wherein each data set of parameter values of the first information vectors comprises a frequency, an amplitude and a pulse width of a respective separated signal separated by the filter of a respective channel,
wherein the control module is configured to:
collect the data sets of parameter values of the first information vectors; and
direct a filter of one channel of the multiplicity of channels to separate a particular frequency based on the collected data sets of parameter values of the information vectors.

18. The system as recited in claim 17, wherein the control module is further configured to:
find an event in the collected data sets of parameter values of the first information vectors, which found event is associated with the particular frequency;
associate a signal-of-interest priority value with the found event;
determine a current minimum signal-of-interest priority value associated with one channel of the multiplicity of channels; and
compare the signal-of-interest priority value associated with the found event to the current minimum signal-of-interest priority value,
wherein the one channel is directed to tune its filter with the particular frequency in response to the signal-of-interest priority value associated with the found event being greater than the current minimum signal-of-interest priority value.

19. The system as recited in claim 18, wherein the control module is further configured to determine whether any other channel of the multiplicity of channels is currently processing the particular frequency or not, wherein the control module determines the current minimum signal-of-interest priority value in response to a determination that none of the multiplicity of channels are currently processing the particular frequency.

20. The system as recited in claim 18, wherein the signal denoising module is further configured to generate second information vectors comprising respective data sets of parameter values of denoised signals, wherein each data set of parameter values of the second information vectors comprises a frequency range and an energy of a respective denoiser state, and the control module is further configured to:
collect the data sets of parameter values of the second information vectors;
compute respective energies corresponding to the collected first information vectors; and
subtract the computed energies corresponding to the collected first information vectors from the total energies of the collected second information vectors for each frequency range.

21. The system as recited in claim 20, wherein the operation of associating a signal-of-interest priority value with the found event comprises setting the associated signal-of-interest priority value equal to a maximum of a first a priori signal-of-interest priority value corresponding to the particular frequency and a second a priori signal-of-interest priority value corresponding to a denoiser energy of a denoiser state having the particular frequency.

* * * * *